United States Patent
Kwon

(10) Patent No.: US 9,865,602 B2
(45) Date of Patent: Jan. 9, 2018

(54) SEMICONDUCTOR DEVICES HAVING BIT LINES AND METHOD OF FABRICATING THE SAME

(71) Applicant: Samsung Electronics Co., Ltd., Suwon-si, Gyeonggi-do (KR)

(72) Inventor: Yongbum Kwon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 30 days.

(21) Appl. No.: 15/048,075

(22) Filed: Feb. 19, 2016

(65) Prior Publication Data

US 2016/0276349 A1 Sep. 22, 2016

(30) Foreign Application Priority Data

Mar. 20, 2015 (KR) .................. 10-2015-0039063

(51) Int. Cl.
*H01L 27/108* (2006.01)
*H01L 23/528* (2006.01)
*H01L 29/06* (2006.01)

(52) U.S. Cl.
CPC ...... *H01L 27/10814* (2013.01); *H01L 23/528* (2013.01); *H01L 27/10823* (2013.01); *H01L 27/10855* (2013.01); *H01L 27/10876* (2013.01); *H01L 27/10885* (2013.01); *H01L 27/10888* (2013.01); *H01L 29/0649* (2013.01)

(58) Field of Classification Search
CPC ............ H01L 27/10814; H01L 23/528; H01L 27/10823; H01L 27/10855; H01L 27/10876; H01L 27/10885; H01L 27/10888; H01L 29/0649
See application file for complete search history.

(56) References Cited

U.S. PATENT DOCUMENTS

| 8,435,876 | B2 | 5/2013 | Park et al. |
| 8,860,110 | B2 | 10/2014 | Lee |
| 2004/0253811 | A1 | 12/2004 | Lee et al. |
| 2007/0197021 | A1 | 8/2007 | Nam et al. |
| 2014/0110816 | A1 | 4/2014 | Kim et al. |
| 2014/0167250 | A1 | 6/2014 | Park |
| 2014/0299989 | A1 | 10/2014 | Lim et al. |
| 2015/0061134 | A1* | 3/2015 | Lee ................ H01L 21/764 257/751 |
| 2016/0181143 | A1* | 6/2016 | Kwon ............. H01L 27/1052 438/586 |

FOREIGN PATENT DOCUMENTS

| KR | 1020010048350 | 6/2001 |
| KR | 1020040051087 | 6/2004 |
| KR | 1020140081549 | 7/2014 |

* cited by examiner

*Primary Examiner* — Fernando L Toledo
*Assistant Examiner* — Neil Prasad
(74) *Attorney, Agent, or Firm* — Myers Bigel, P.A.

(57) ABSTRACT

Semiconductor devices and methods of forming the semiconductor devices are provided. The semiconductor devices may include a bit line provided to cross an active region of a substrate, isolation patterns provided on the substrate to face each other in a direction parallel to the bit line, a storage node contact provided between the isolation patterns to be in contact with a source/drain region provided in an upper portion of the active region, and a spacer provided between the bit line and the storage node contact. Here, the isolation patterns may include a material having an etch selectivity with respect to the spacer.

20 Claims, 54 Drawing Sheets

SEMICONDUCTOR DEVICES HAVING BIT LINES AND METHOD OF FABRICATING THE SAME

CROSS-REFERENCE TO RELATED APPLICATION

This U.S. non-provisional patent application claims priority under 35 U.S.C. §119 to Korean Patent Application No. 10-2015-0039063, filed on Mar. 20, 2015, the disclosure of which is hereby incorporated by reference in its entirety.

BACKGROUND

The present disclosure relates to semiconductor devices and methods of fabricating the same, and, in particular, to semiconductor devices with improved electrical characteristics and methods of fabricating the same.

Semiconductor devices are widely used in the electronics industry because of their small size, multi-functionality and/or low fabrication cost. With the tremendous advance in the electronics industry in recent years, there has been a rapidly increasing demand for high-density semiconductor devices. To increase the integration density of semiconductor devices, it may be necessary to reduce a pattern width of the semiconductor devices. However, extremely expensive process equipments needed to reduce a pattern width may be a practical limitation on increasing integration for semiconductor memory devices. Accordingly, many recent studies have been conducted on new integration techniques.

SUMMARY

The present disclosure relates to a semiconductor device with improved electrical characteristics.

According to some embodiments of the inventive concepts, a semiconductor device may include a substrate including an active region, a bit line on the active region, the bit line crossing the active region, a plurality isolation patterns provided on the substrate to face each other in a direction parallel to the bit line, a storage node contact provided between the isolation patterns to be in contact with a source/drain region provided in an upper portion of the active region, and a spacer provided between the bit line and the storage node contact. Here, the isolation patterns may include a material having an etch selectivity with respect to the spacer.

In some embodiments, the spacer may include a first spacer and a second spacer sequentially stacked on a sidewall of the bit line, and the isolation patterns include a material having an etch selectivity with respect to the second spacer.

In some embodiments, the spacer may further include an additional spacer interposed between the first spacer and the second spacer, and the additional spacer may include a material having an etch selectivity with respect to the isolation patterns.

In some embodiments, the first spacer may include the same material as the isolation patterns, and the additional spacer may include an insulating material, whose dielectric constant is lower than that of the second spacer.

In some embodiments, the spacer may include a first spacer, a second spacer, and a third spacer sequentially stacked on a sidewall of the bit line, and a sidewall of the spacer may include a lower sidewall, an upper sidewall, and a top surface connecting the lower and upper sidewalls to each other. The upper sidewall of the spacer may be a portion of the first spacer, and the lower sidewall of the spacer may be a portion of the third spacer.

In some embodiments, the top surface of the spacer may include top surfaces of the second and third spacers.

In some embodiments, the spacer may include an upper region including an upper sidewall, a lower region including a lower sidewall, and a top surface connecting the upper and lower sidewalls to each other, and the upper region of the spacer may have a width smaller than that of the lower region of the spacer.

In some embodiments, the upper sidewall of the spacer may be spaced apart from the storage node contact, and the lower sidewall of the spacer may be in contact with the storage node contact.

In some embodiments, the top surface of the spacer may be positioned at the same level as a top surface of the storage node contact.

In some embodiments, the semiconductor device may further include a landing pad disposed to cover a top surface of the storage node contact, the top surface of the spacer, and the upper sidewall of the spacer.

In some embodiments, the lowermost surface of the landing pad may be in contact with the top surface of the storage node contact and the top surface of the spacer.

In some embodiments, the lowermost surface of the landing pad may have a width larger than that of the top surface of the storage node contact.

In some embodiments, the semiconductor device may further include an insulating pattern disposed on the bit line. The spacer may be extended to cover a sidewall of the insulating pattern, and the top surface of the spacer may be positioned between a top surface of the bit line and a top surface of the insulating pattern.

In some embodiments, the isolation patterns may include at least one of SiBCN, SiCN, SiOCN, or SiN.

In some embodiments, the semiconductor device may further include bit line node pattern provided in the active region and below the bit line to connect the bit line to the active region, a plurality of word lines provided in the substrate to cross the active region and the bit line in a plan view, and a memory element electrically connected with the storage node contact.

According to example embodiments of the inventive concepts, a semiconductor device may include a substrate including an active region, a bit line on the active region, the bit line crossing the active region, a plurality of isolation patterns on the substrate to face each other in a direction parallel to the bit line, a storage node contact between the isolation patterns to be in contact with a source/drain region provided in an upper portion of the active region, a landing pad on the storage node contact, and a spacer between the bit line and the storage node contact. The spacer includes an upper region including an upper sidewall, a lower region including a lower sidewall and having a width larger than that of the upper region, and a top surface connecting the upper and lower sidewalls of the spacer to each other. The landing pad is provided to cover a top surface of the storage node contact, the top surface of the spacer, and the upper sidewall of the spacer. The isolation patterns include a material having an etch selectivity with respect to the spacer.

In some embodiments, the isolation patterns may include at least one of SiBCN, SiCN, SiOCN, or SiN, and the spacer includes at least one of SiN or $SiO_2$.

In some embodiments, the upper region of the spacer may be provided in a form of a single layer to cover a first portion of a sidewall of the bit line, and the lower region of the spacer may be provided to have a multi-layered structure including at least two layers and to sequentially cover a second portion of the sidewall of the bit line that is different from the first portion of the sidewall of the bit line.

In some embodiments, the spacer may extend parallel to the bit line and between the bit line and the isolation patterns. A width of the upper region of the spacer may be larger between the bit line and the isolation patterns than between the bit line and the landing pad.

According to example embodiments of the inventive concepts, a semiconductor device may include a substrate including an active region, a bit line on the active region, the bit line crossing the active region, a plurality of isolation patterns on the substrate to face each other in a direction parallel to the bit line, a storage node contact between the isolation patterns to be in contact with a source/drain region provided in an upper portion of the active region, a landing pad on the storage node contact, a spacer between the bit line and the storage node contact, a bit line node pattern in the active region and below the bit line to connect the bit line to the active region, and a plurality of word lines in the substrate to cross the active region and the bit line in a plan view. The spacer may include an upper region including an upper sidewall, a lower region including a lower sidewall and having a width larger than that of the upper region, and a top surface connecting the upper and lower sidewalls of the spacer to each other. The landing pad may be provided on top surfaces of the storage node contact and the spacer, and the isolation patterns may include a material having an etch selectivity with respect to the spacer.

BRIEF DESCRIPTION OF THE DRAWINGS

The forgoing and other features of the inventive concepts will be described below in more detail with reference to the accompanying drawings of non-limiting embodiments of the inventive concepts in which like reference characters refer to like parts throughout the different views. The drawings are not necessarily to scale, emphasis instead being placed upon illustrating principles of the inventive concepts. In the drawings:

FIGS. 5A to 17A are plan views illustrating a method of fabricating a semiconductor device according to example embodiments of the inventive concepts;

FIGS. 5B to 17B are cross-sectional views taken along the lines I-I' in FIGS. 5A to 17A, respectively;

FIGS. 5C to 17C are cross-sectional views taken along the lines II-II' in FIGS. 5A to 17A, respectively;

FIGS. 5D to 17D are cross-sectional views taken along the lines III-III' in FIGS. 5A to 17A, respectively;

DETAILED DESCRIPTION

Figure 1:
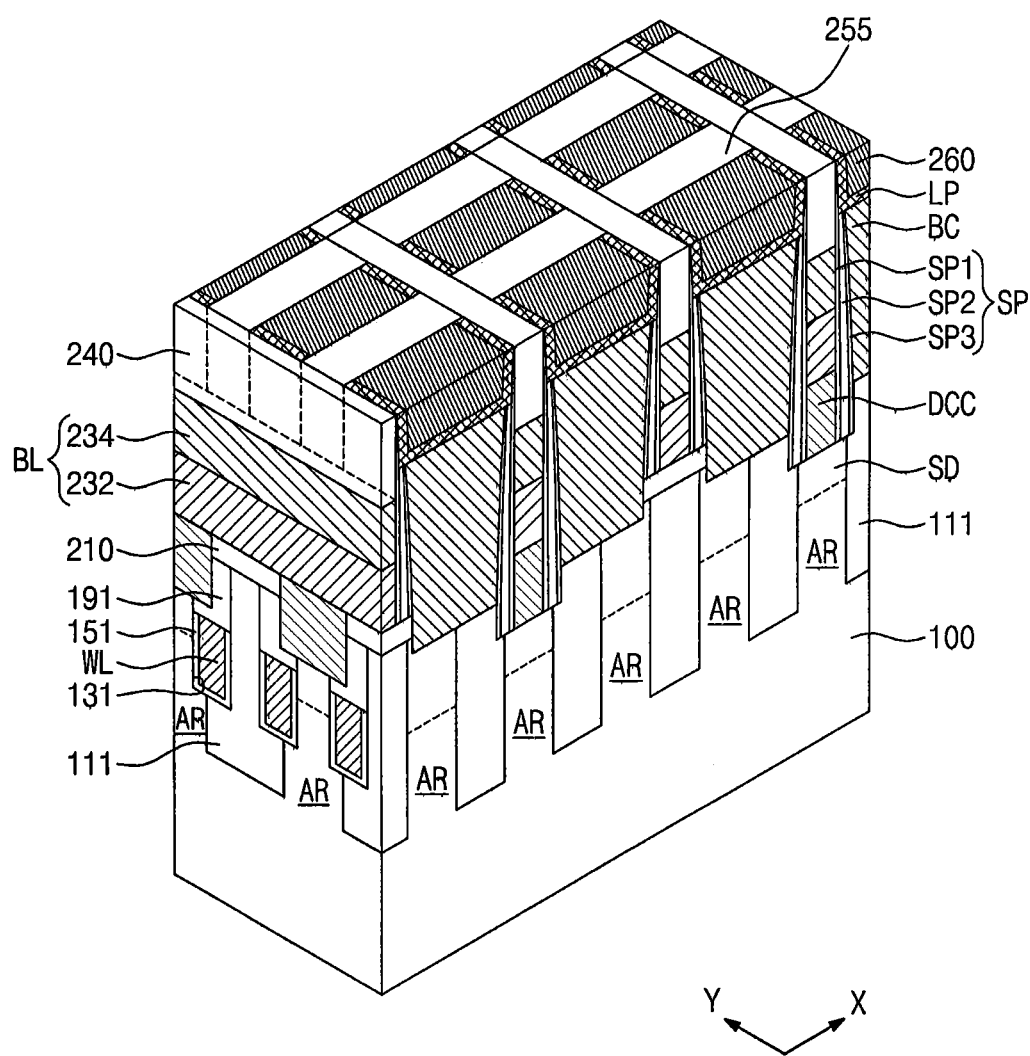
FIG. 1 is a perspective view of a semiconductor device according to example embodiments of the inventive concepts.

The advantages and features of the inventive concepts and methods of achieving them will be apparent from the following example embodiments that will be described in more detail with reference to the accompanying drawings. It should be noted, however, that inventive concepts are not limited to the following example embodiments, and may be implemented in various forms. Accordingly, the example embodiments are provided only to disclose inventive concepts and let those skilled in the art know the category of the inventive concepts.

In the specification, it will be understood that when an element is referred to as being "on" another layer or substrate, it can be directly on the other element, or intervening elements may also be present. In the drawings, thicknesses of elements are exaggerated for clarity of illustration.

Example embodiments of the inventive concepts will be described below with reference to cross-sectional, perspective and plan views that are schematic illustrations of idealized embodiments and intermediate structures of example embodiments. As such, variations from the shapes of the illustrations as a result, for example, of manufacturing techniques and/or tolerances, are to be expected. Accordingly, the example embodiments of the inventive concepts are not limited to specific configurations shown in the drawings, and include modifications based on the method of manufacturing the semiconductor device. For example, an etched region shown at a right angle may be formed in a rounded shape or formed to have a predetermined curvature. Therefore, regions shown in the drawings have schematic characteristics. In addition, the shapes of the regions shown in the drawings exemplify specific shapes of regions in an element, and do not limit the inventive concepts. Though terms like a first, a second, and a third are used to describe various elements in various embodiments of the inventive concepts, the elements are not limited to these terms. These terms are used only to distinguish one element from another element. An embodiment described and exemplified herein includes a complementary embodiment thereof.

The terms used in the specification are for the purpose of describing particular embodiments only and are not intended to be limiting of the inventive concepts. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, steps, operations, elements, and/or components, but do not preclude the presence or addition of one or more other features, steps, operations, elements, components, and/or groups thereof.

Hereinafter, example embodiments of the inventive concepts will be described more fully with reference to accompanying drawings.

Figure 2:
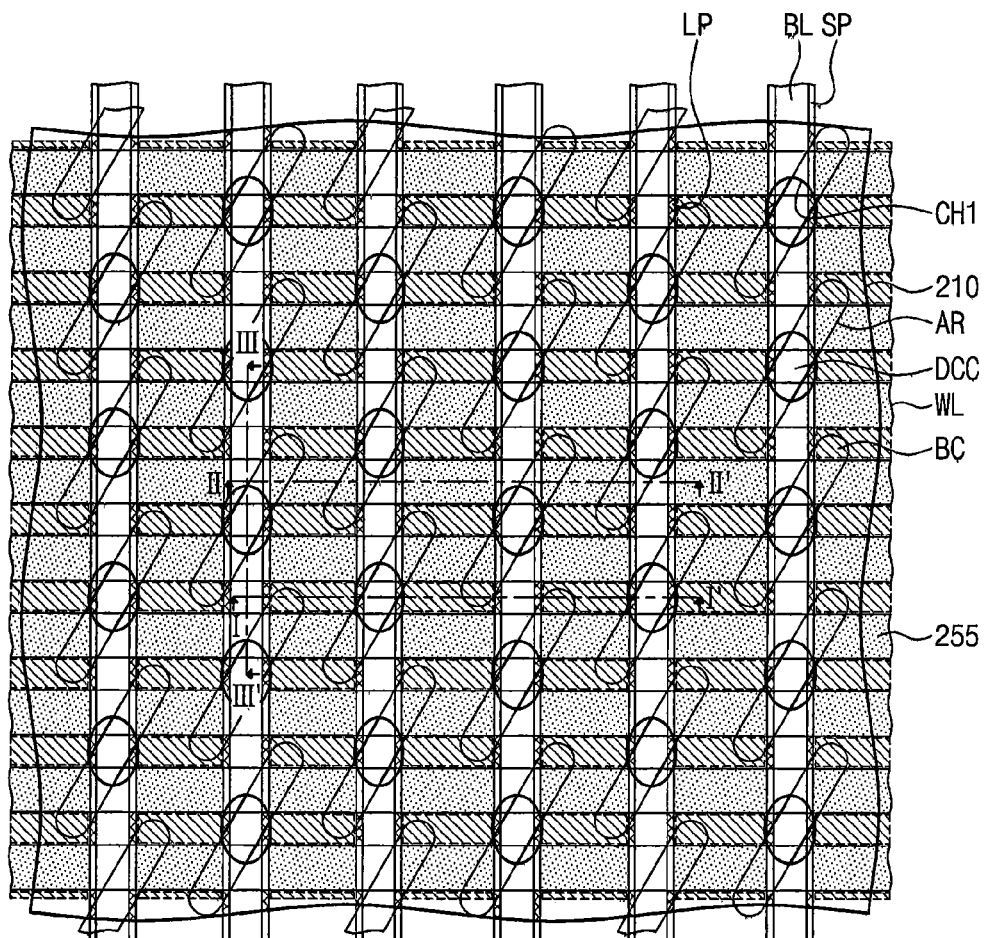
FIG. 2 is a plan view of a semiconductor device according to example embodiments of the inventive concepts.
Figure 2:
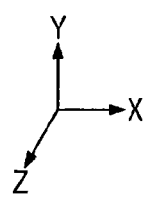
Figure 3A:
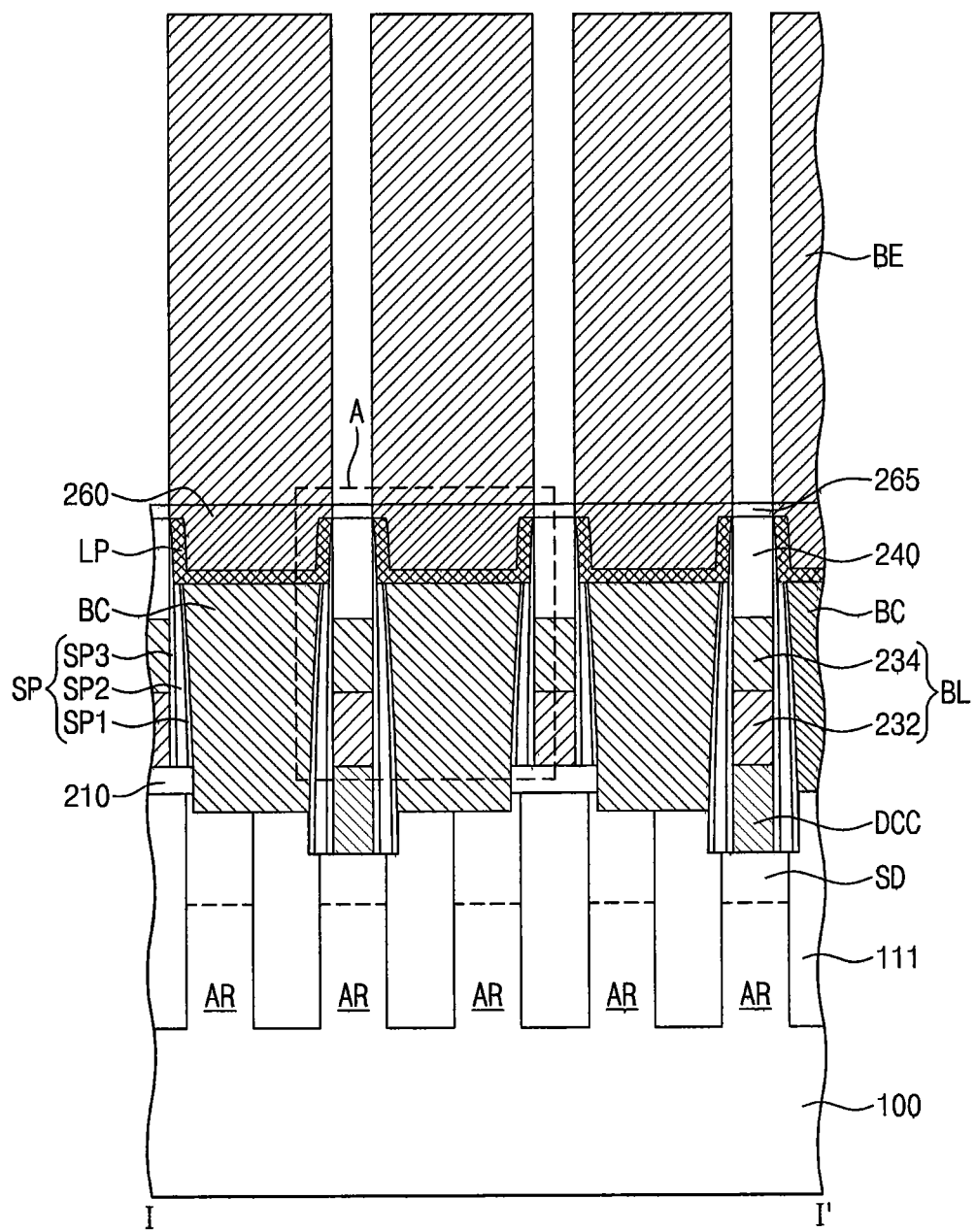
FIGS. 3A to 3C are cross-sectional views taken along the lines I-I', II-II', and III-III' in FIG. 2, respectively.
Figure 3B:
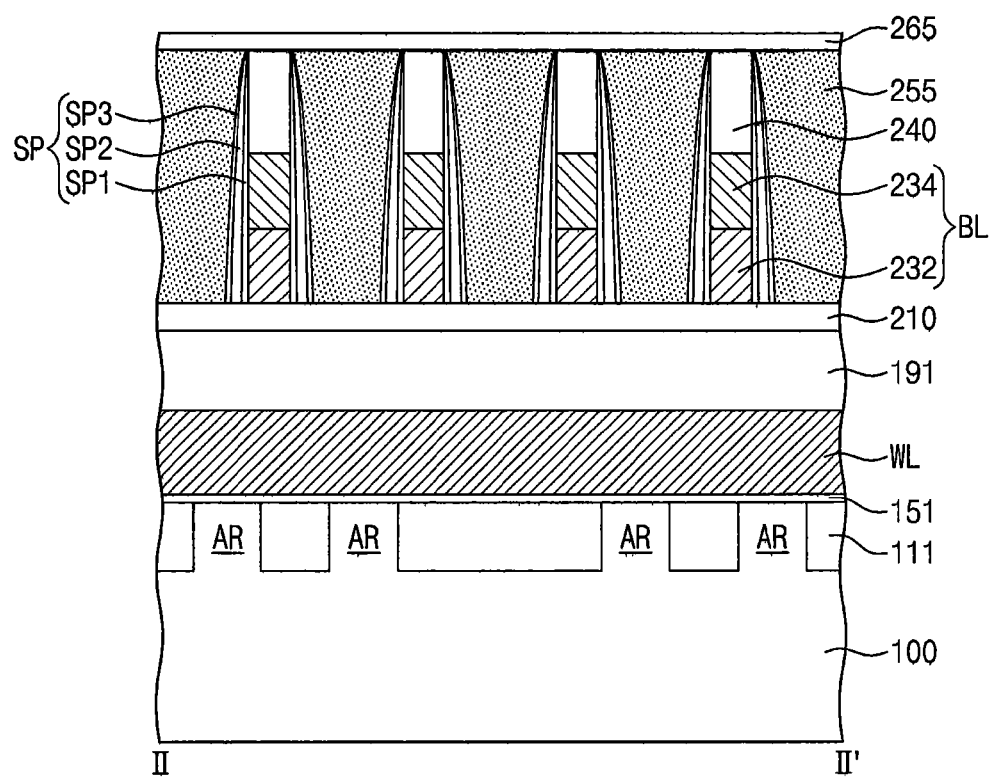
Figure 3C:
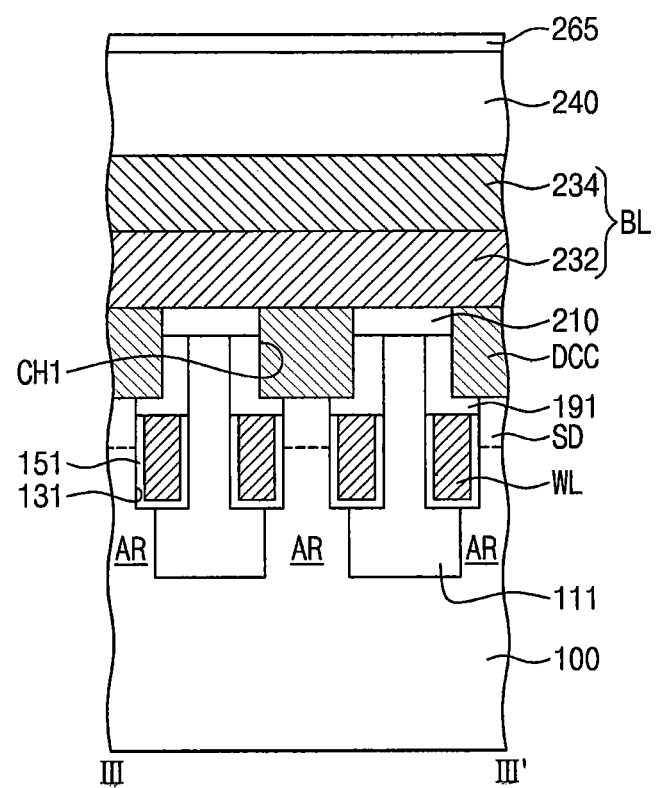
Figure 4:
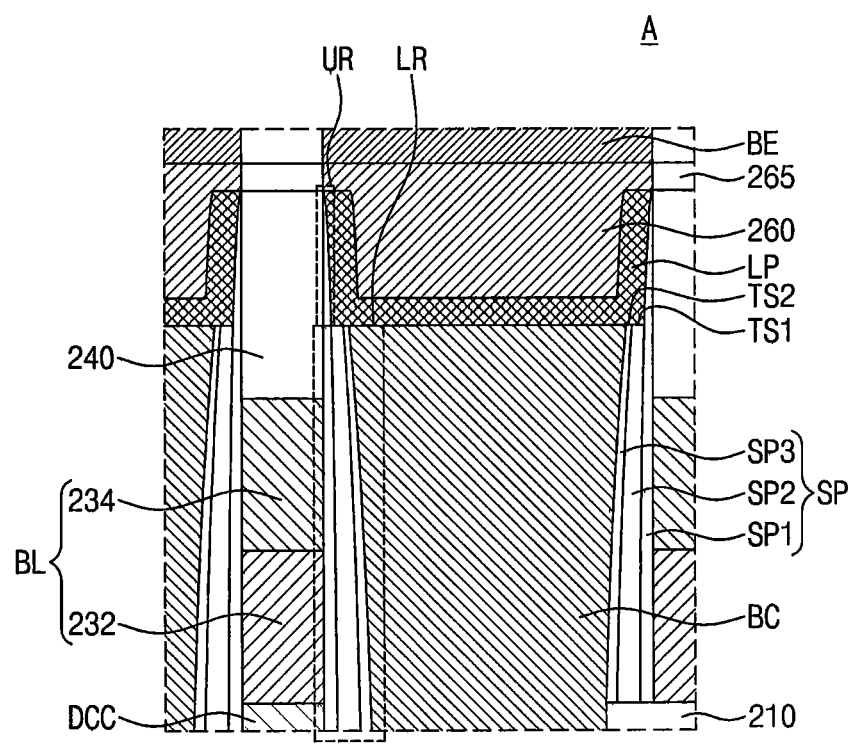
FIG. 4 is an enlarged view of the portion "A" in FIG. 3A.
Figure 5A:
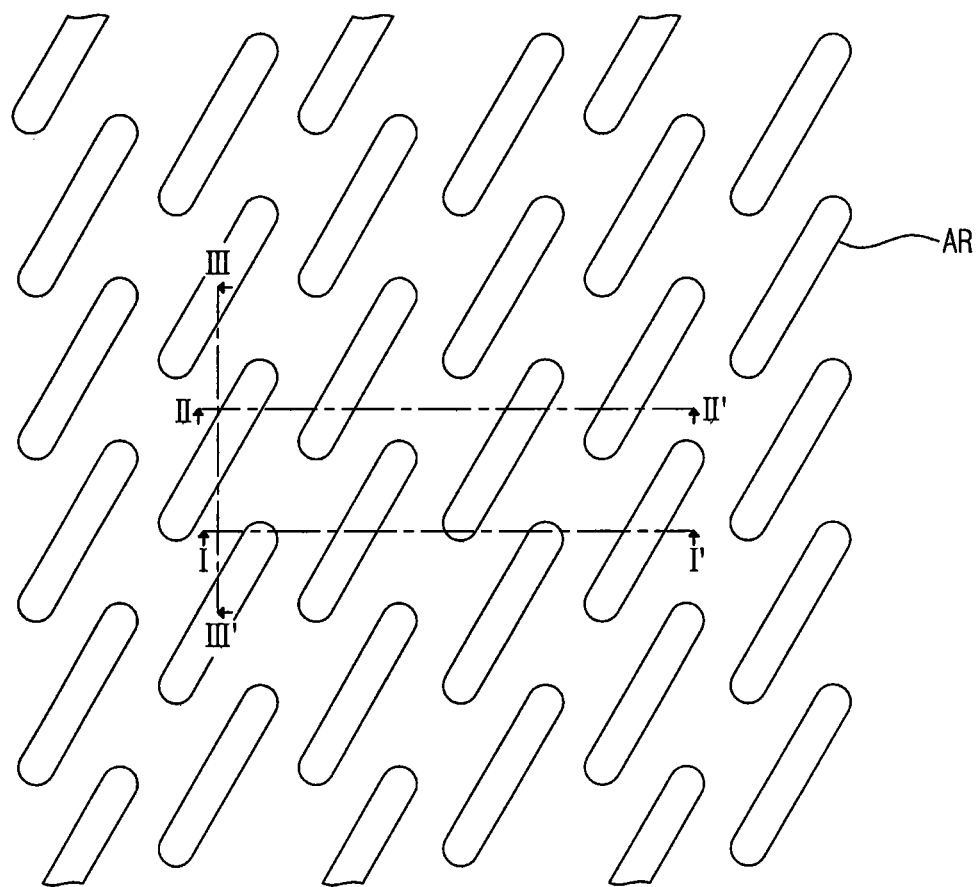
Figure 5B:
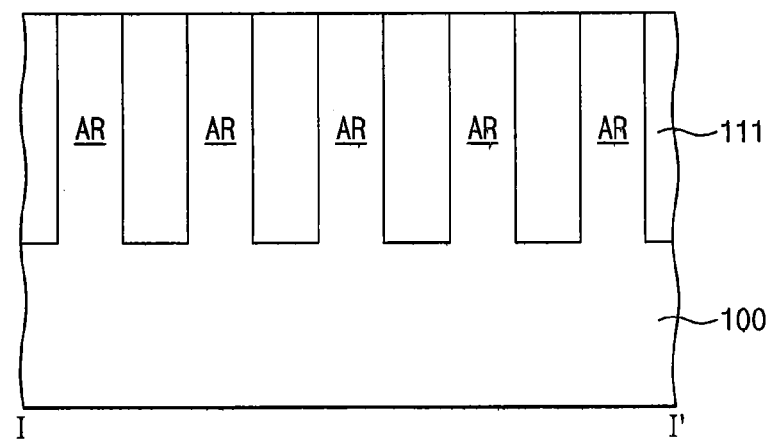
Figure 5C:
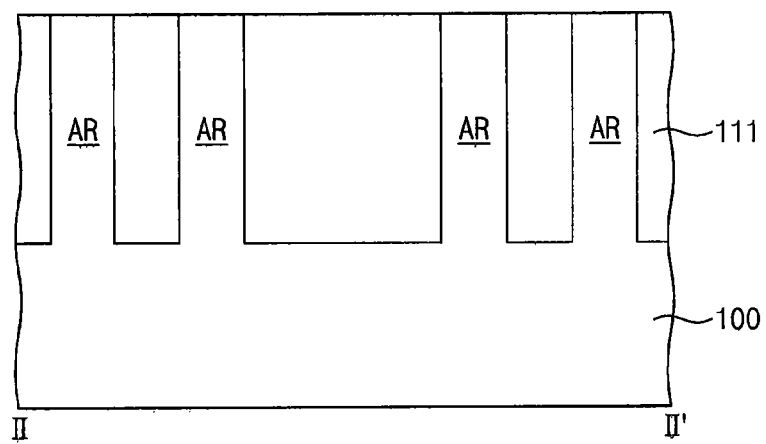
Figure 5D:
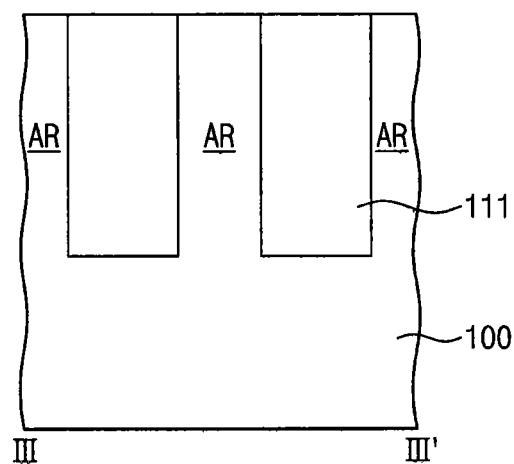
Figure 6A:
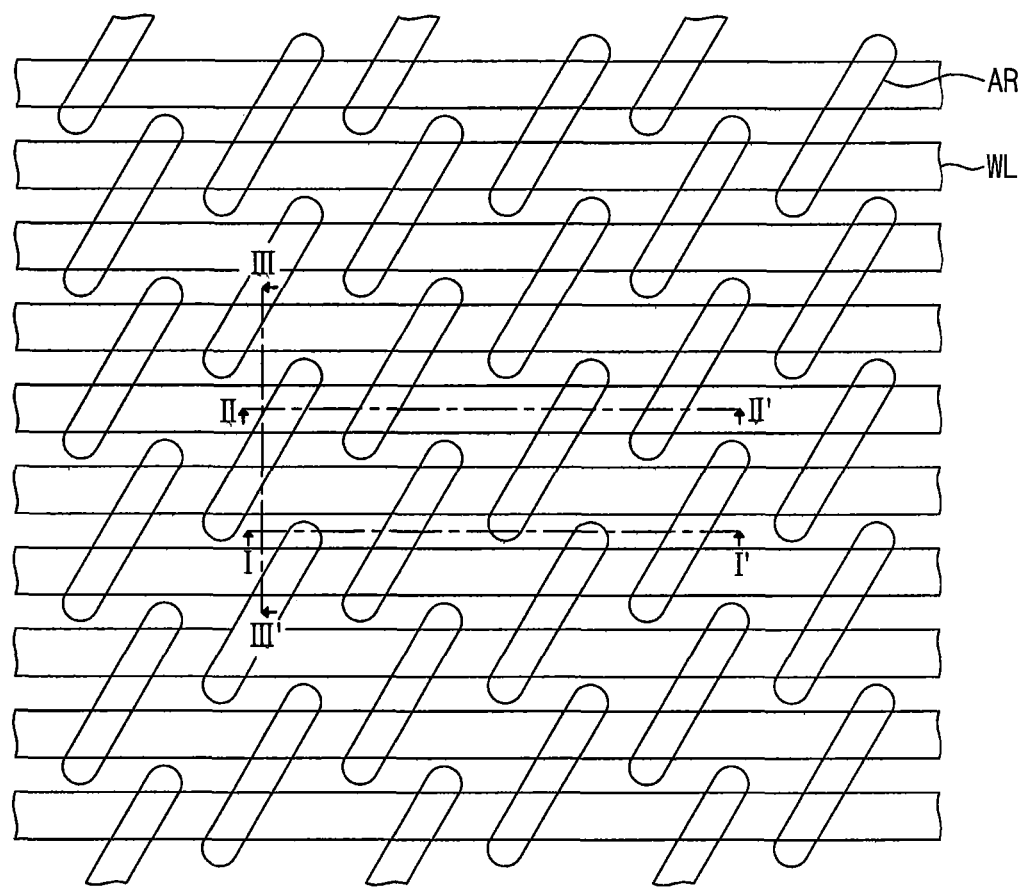
Figure 6B:
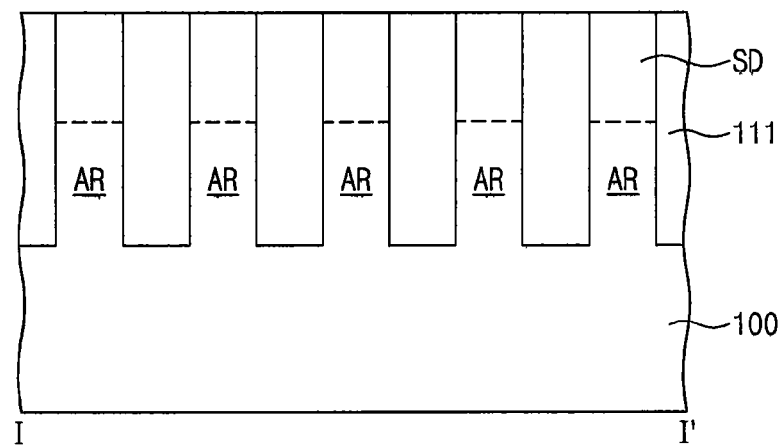
Figure 6C:
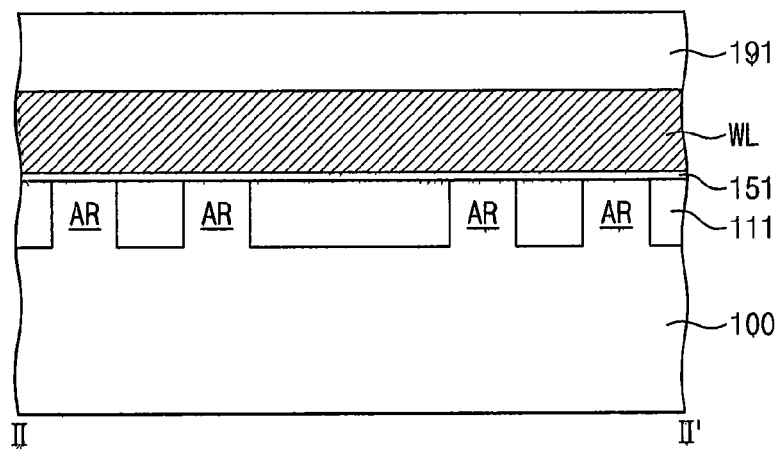
Figure 6D:
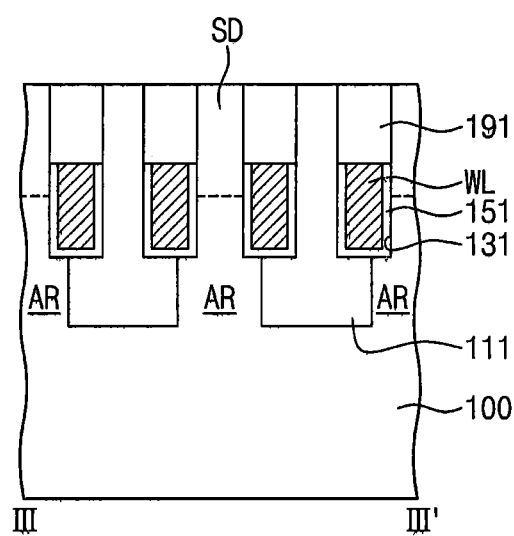
Figure 7A:
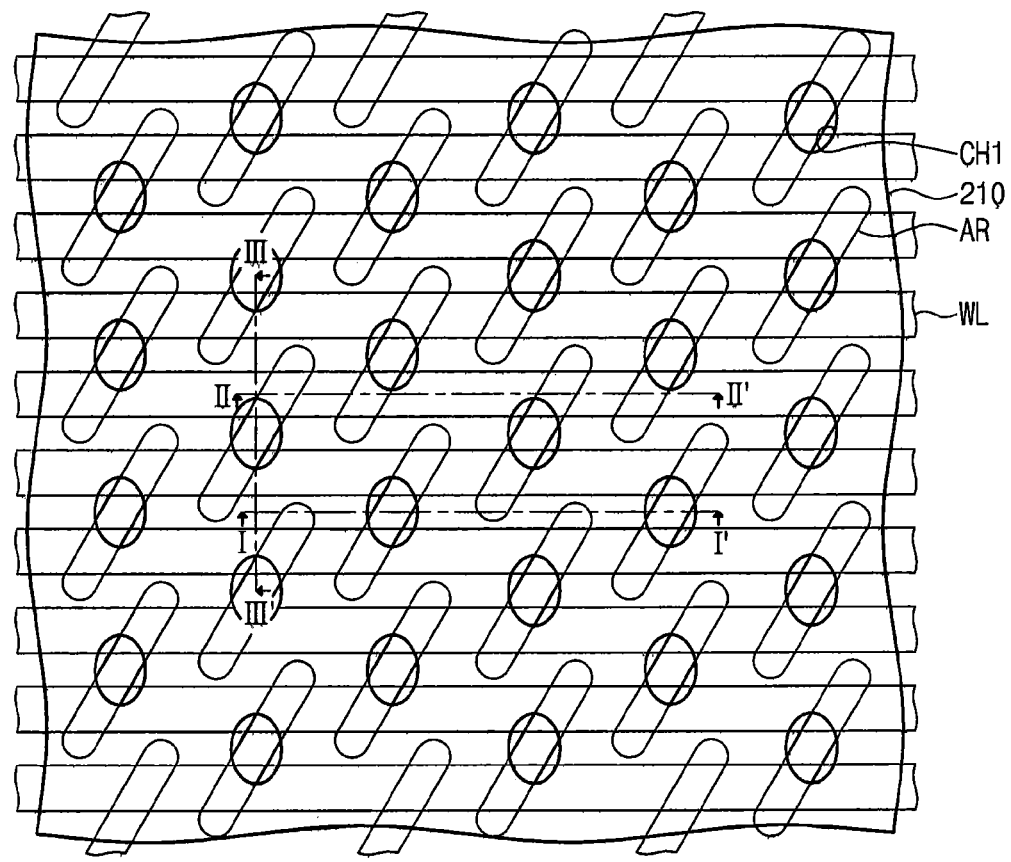
Figure 7A:
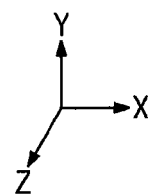
Figure 7B:
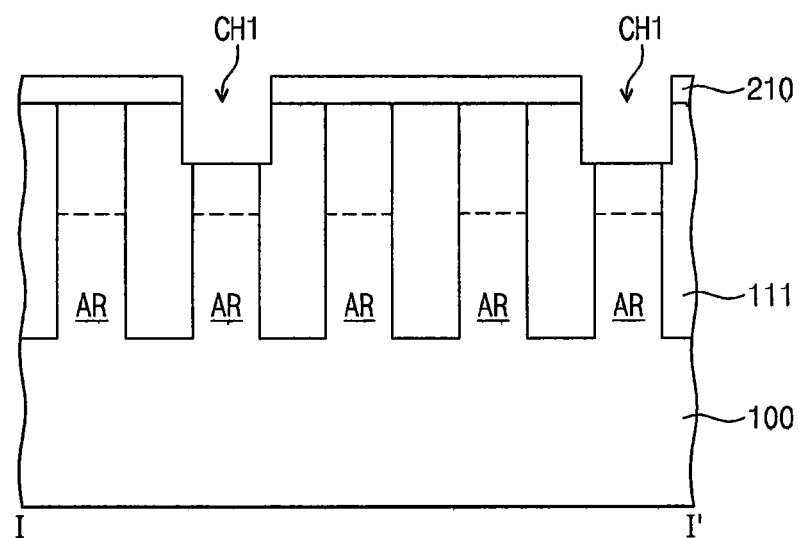
Figure 7C:
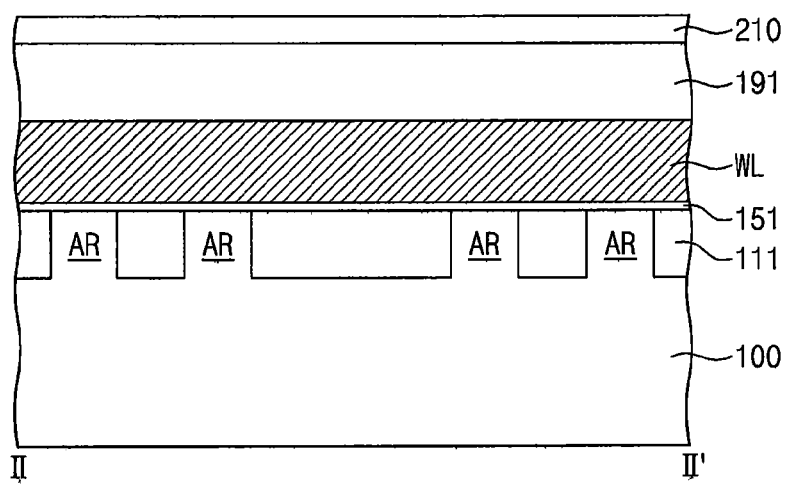
Figure 7D:
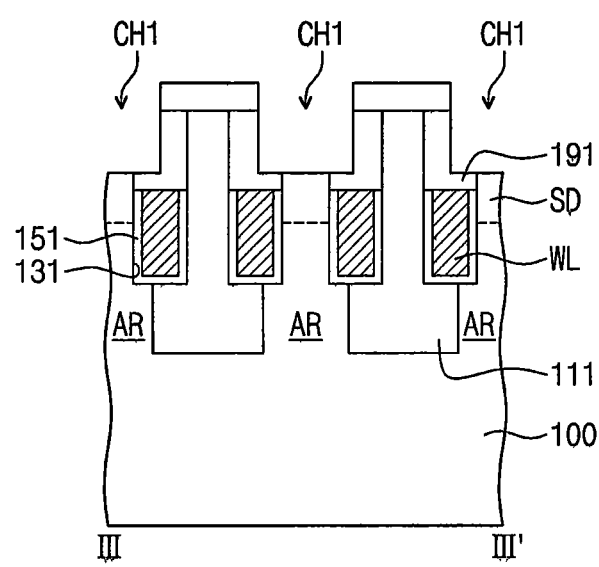
Figure 8A:
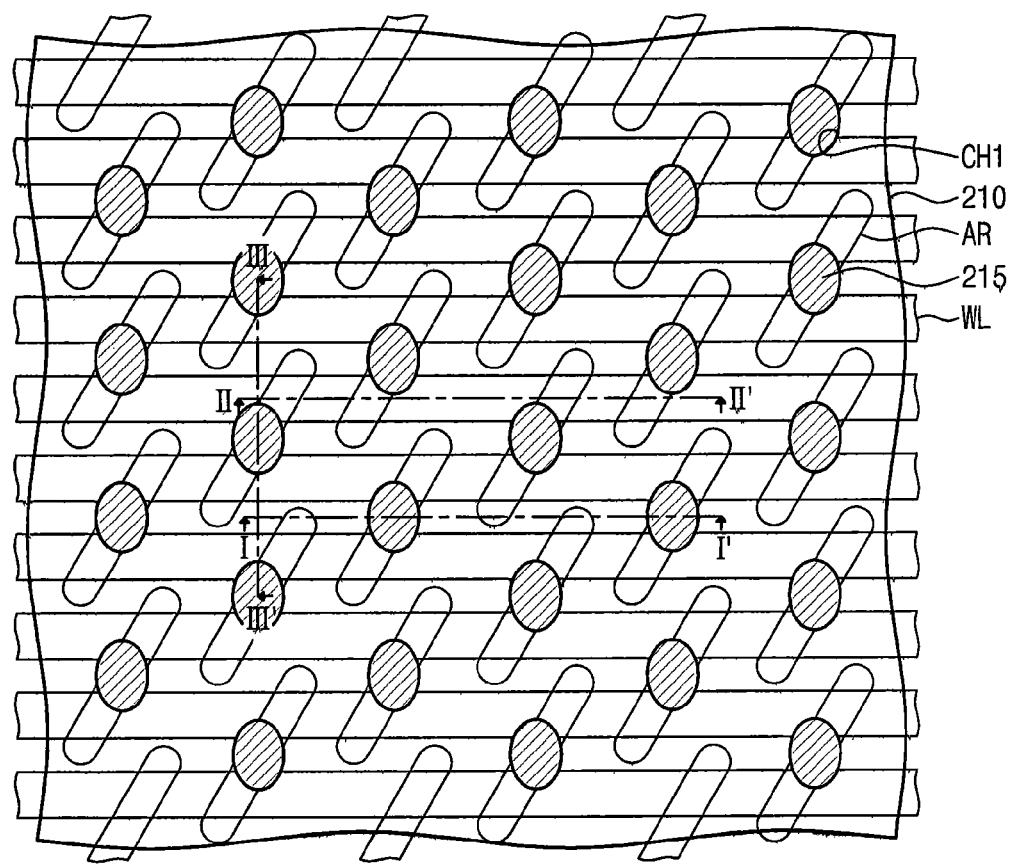
Figure 8B:
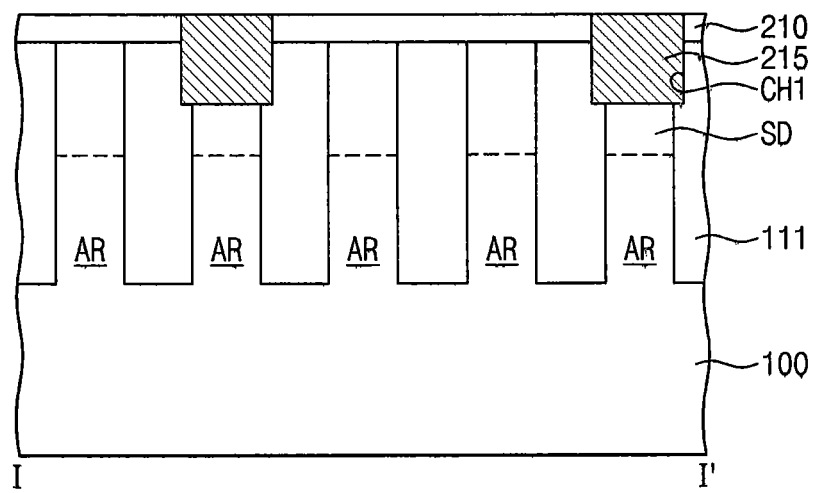
Figure 8C:
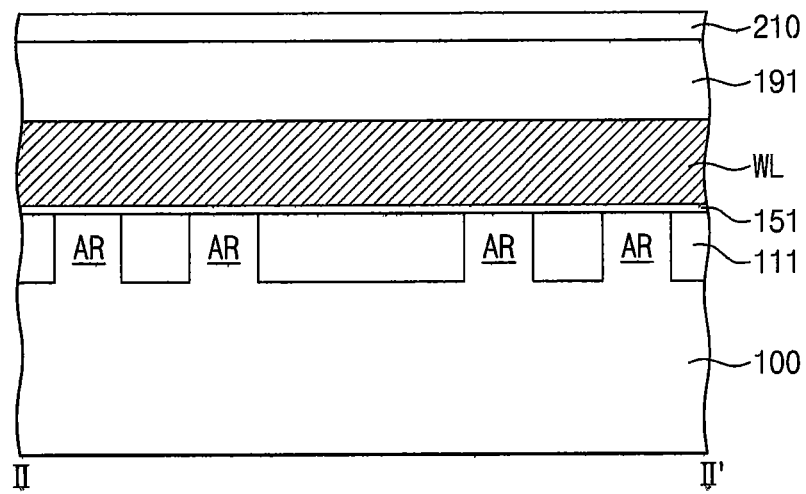
Figure 8D:
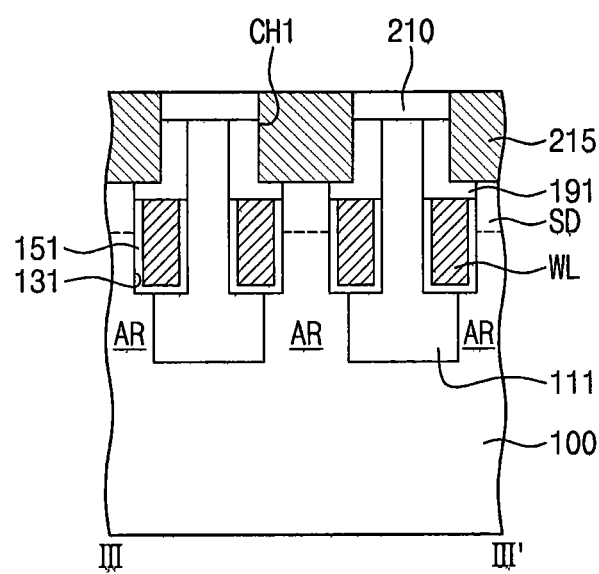
Figure 9A:
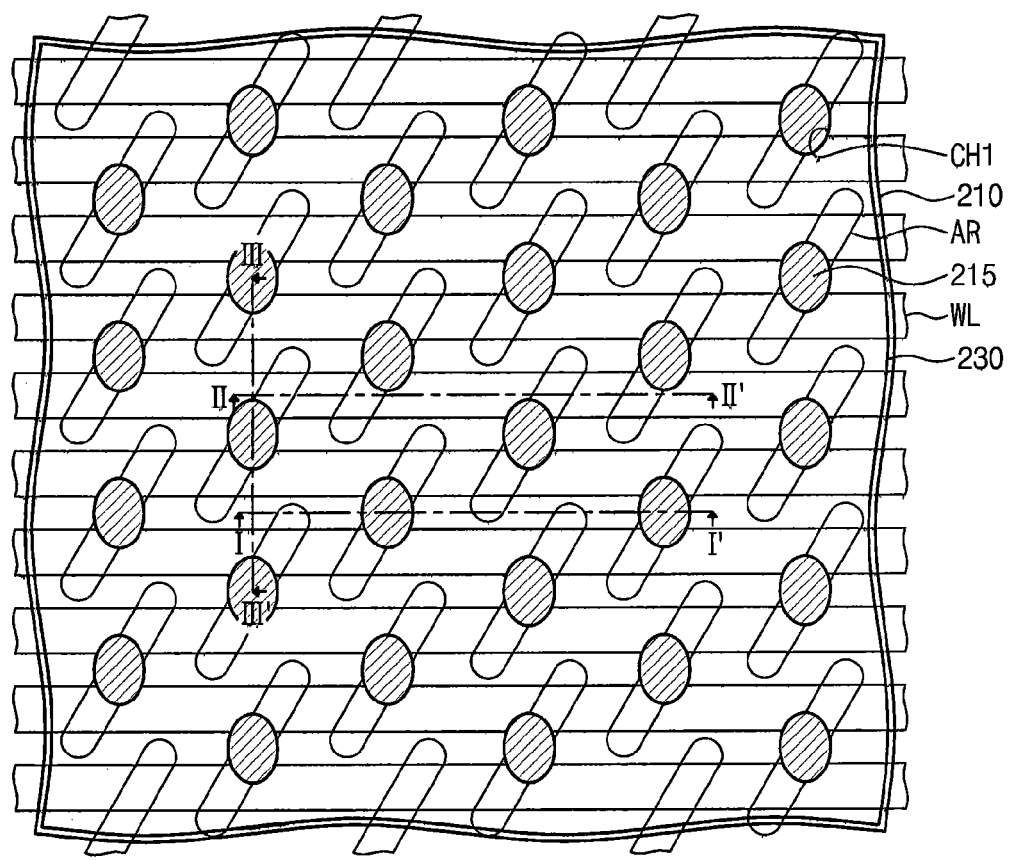
Figure 9A:
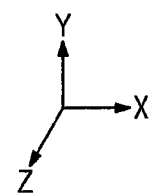
Figure 9B:
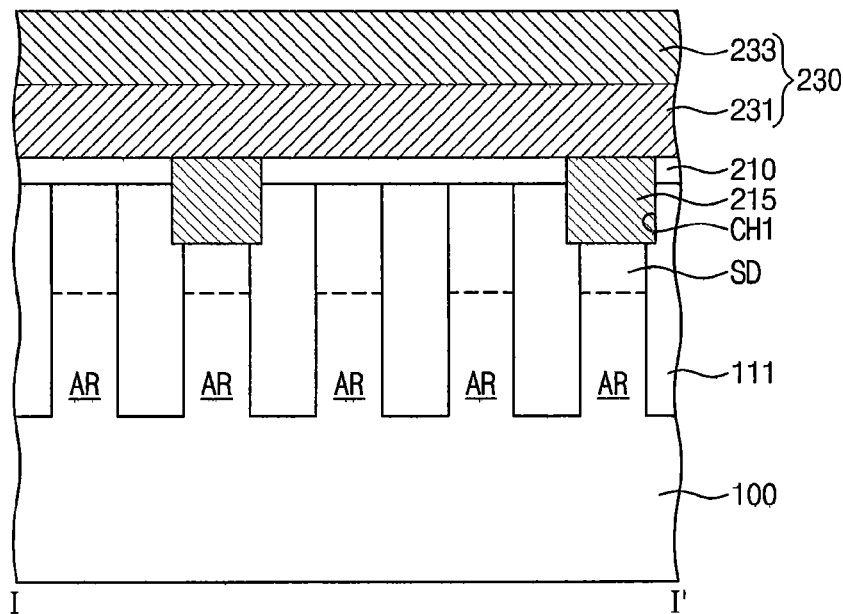
Figure 9C:
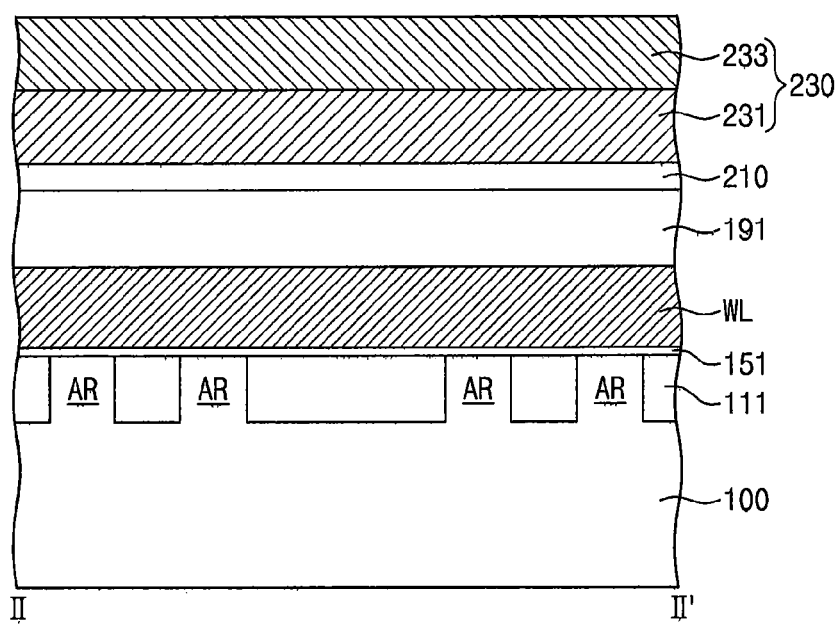
Figure 9D:
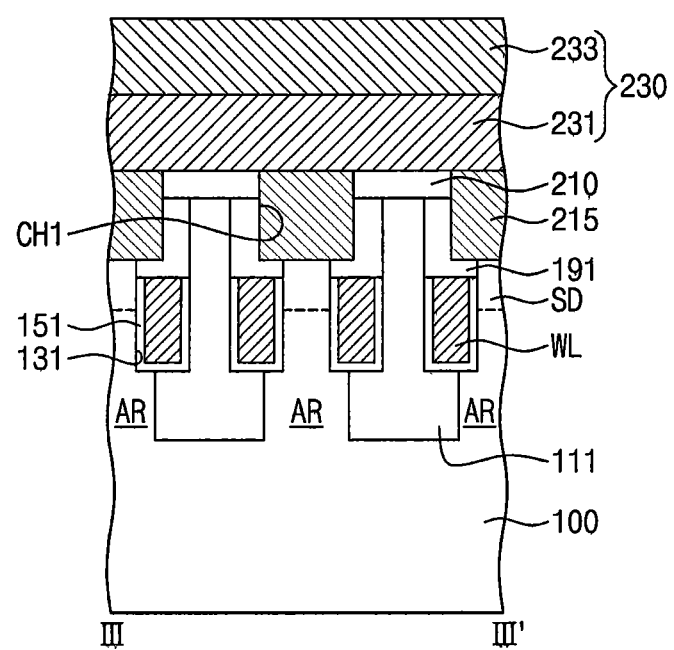
Figure 10A:
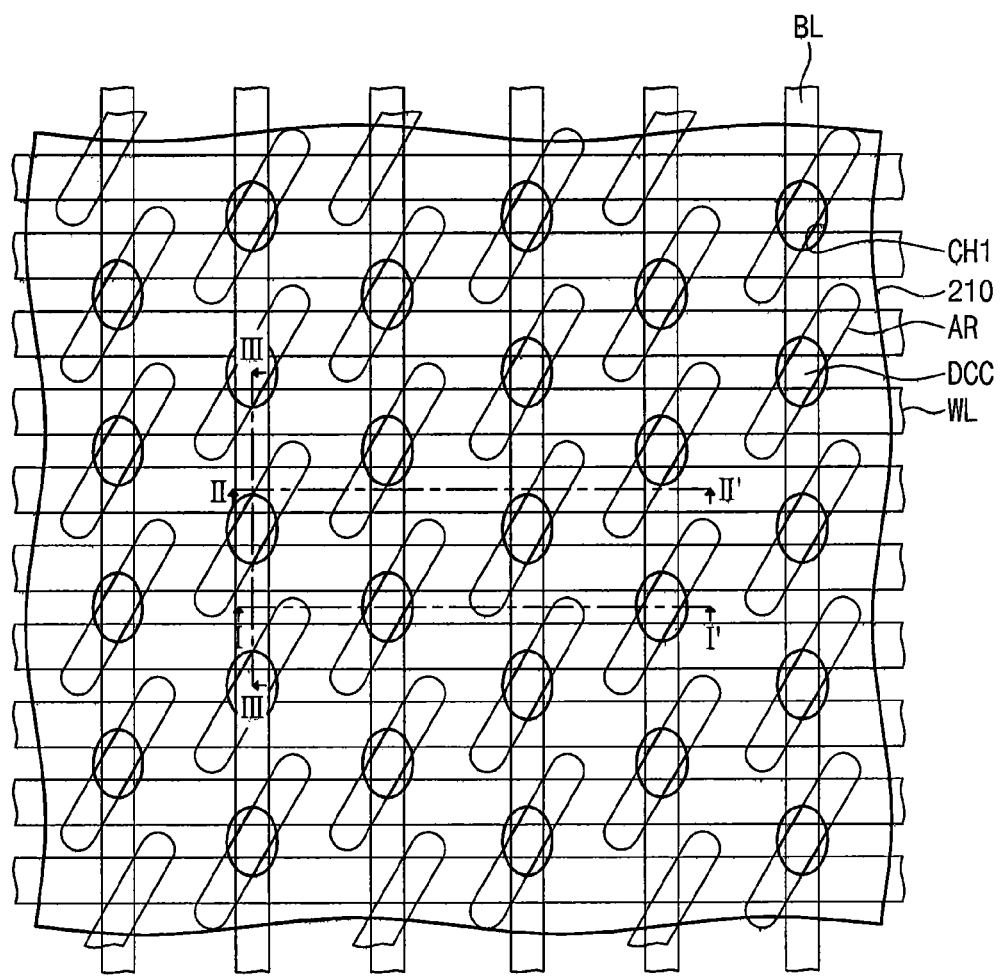
Figure 10B:
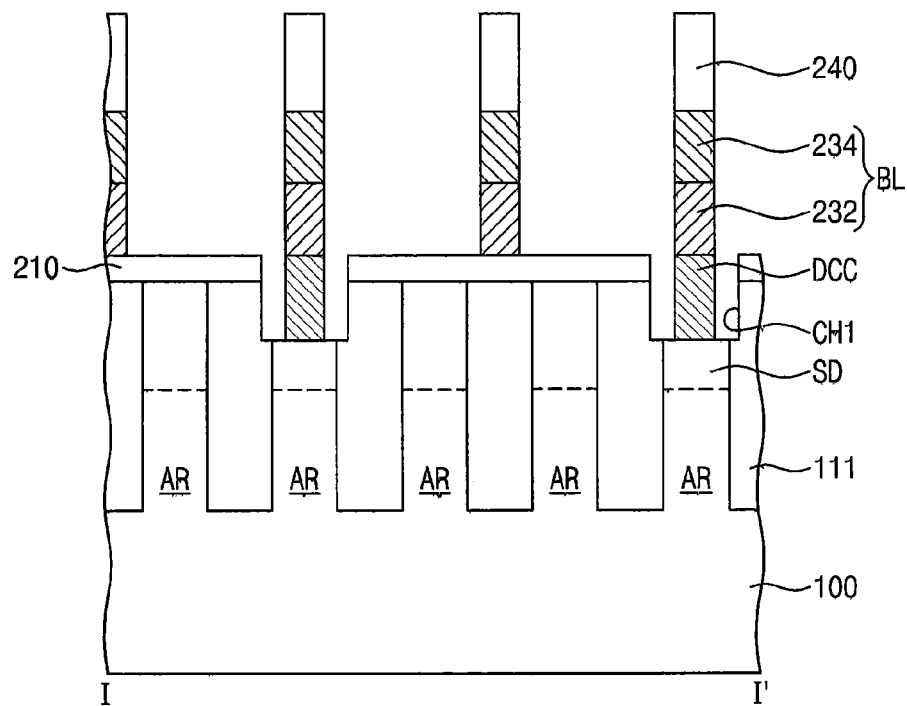
Figure 10C:
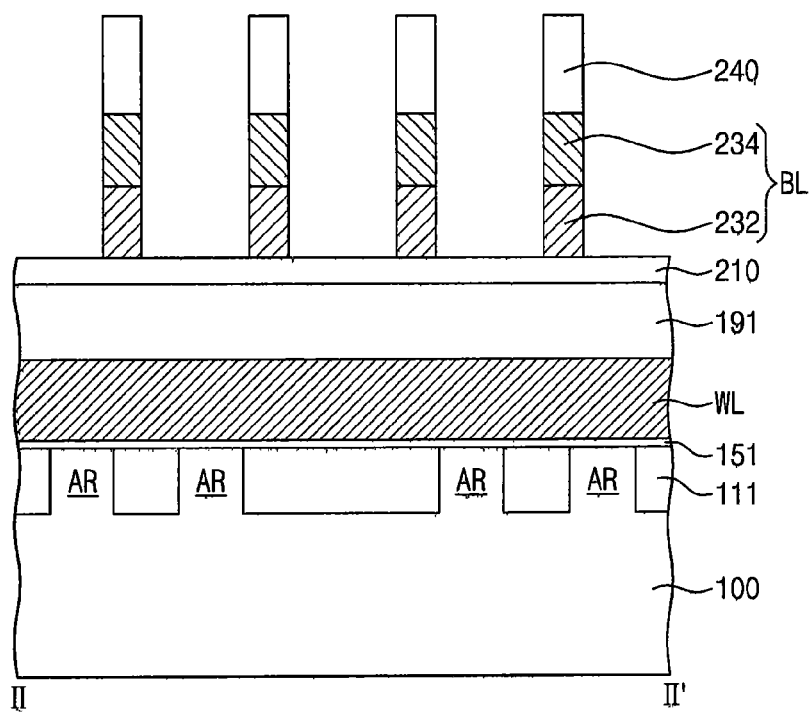
Figure 10D:
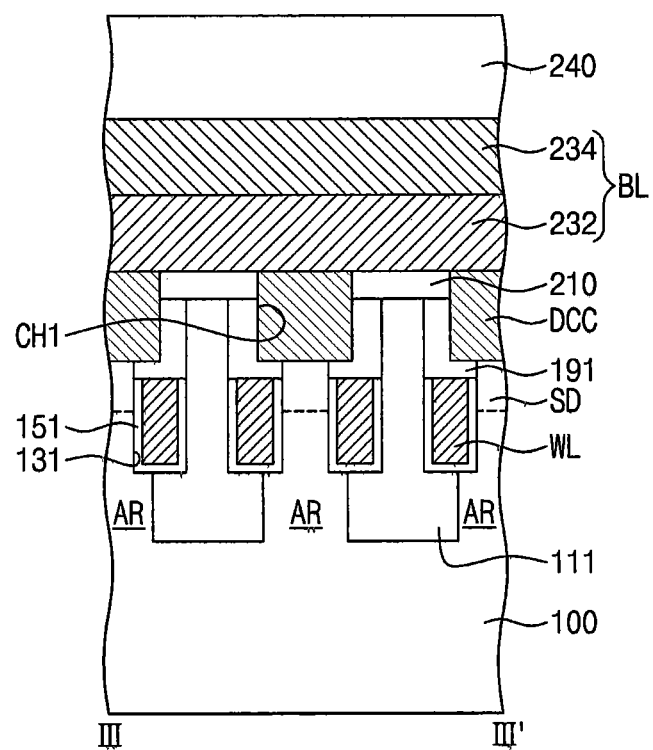
Figure 11A:
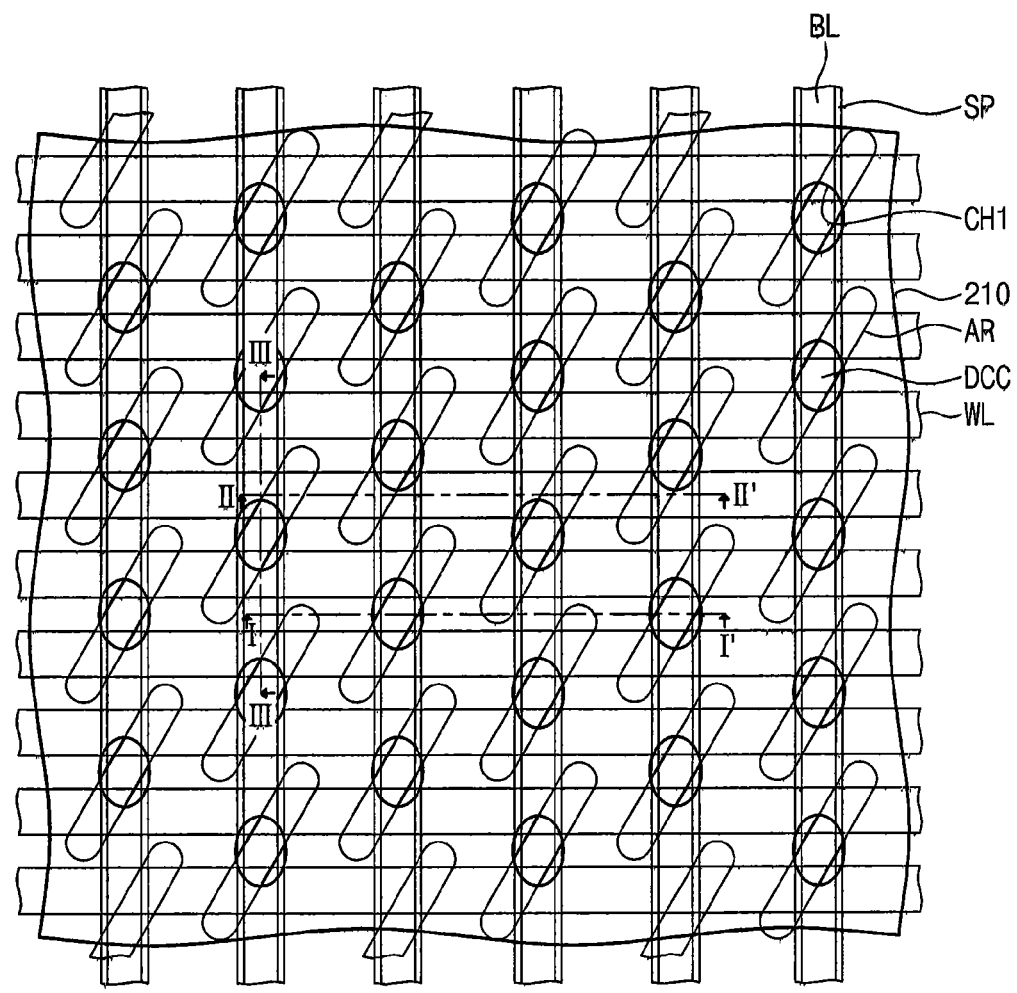
Figure 11A:
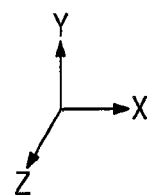
Figure 11B:
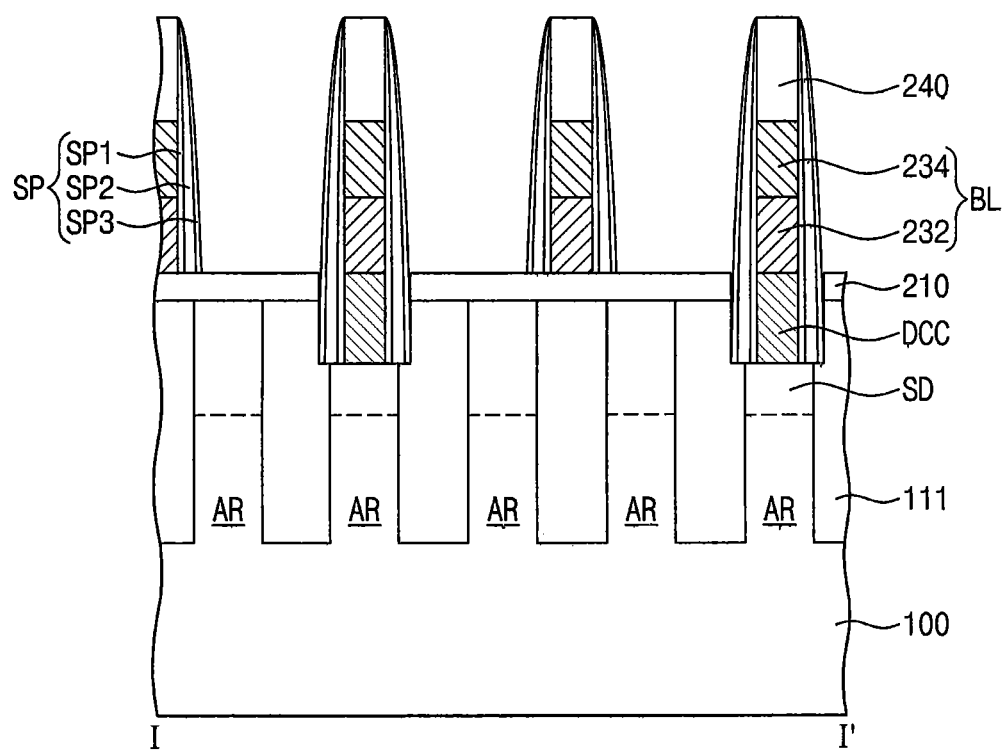
Figure 11C:
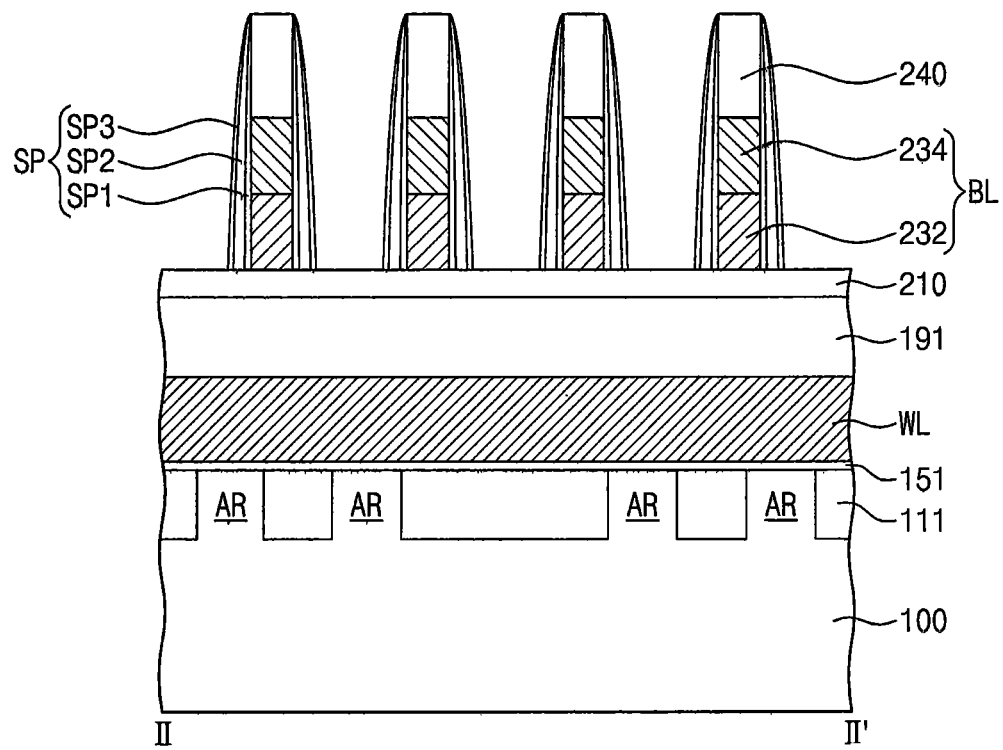
Figure 11D:
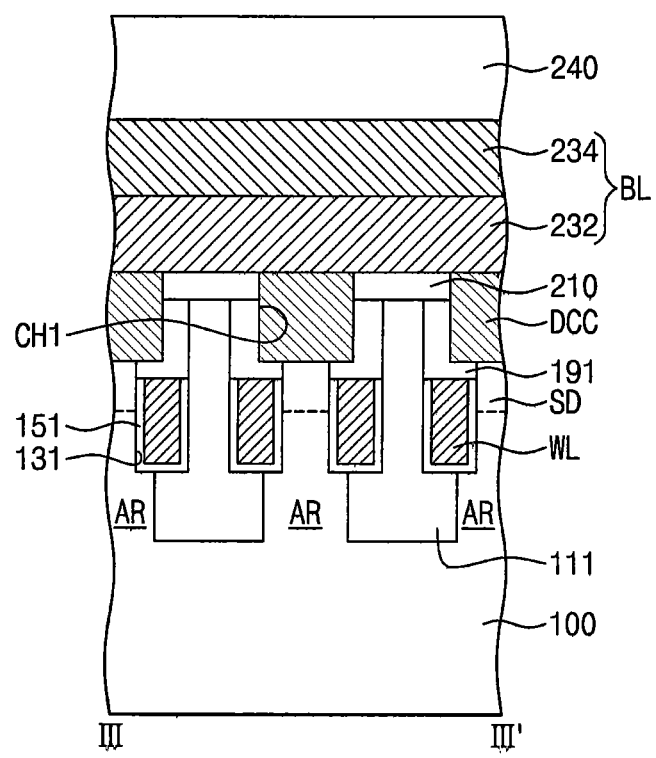
Figure 12A:
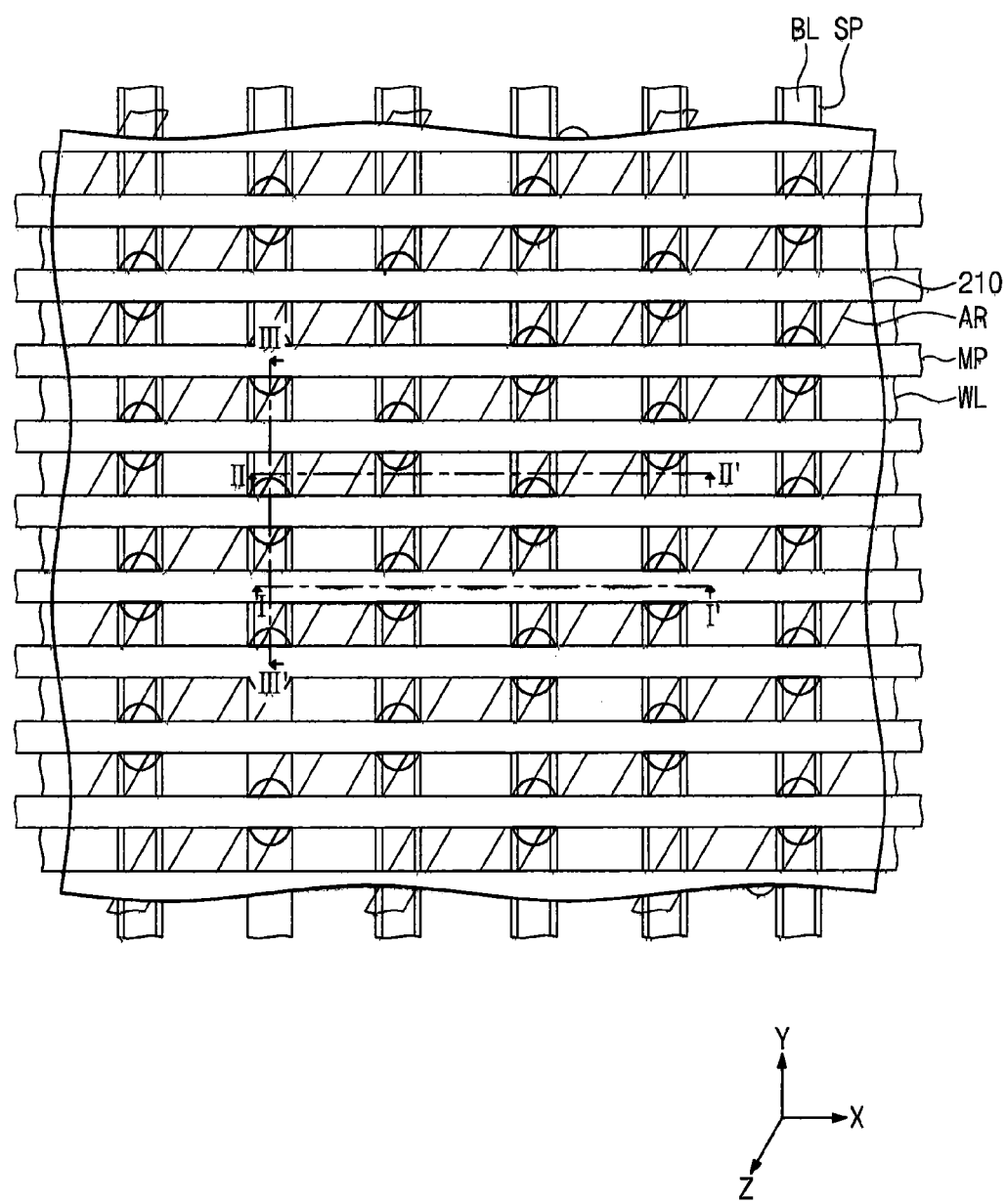
Figure 12B:
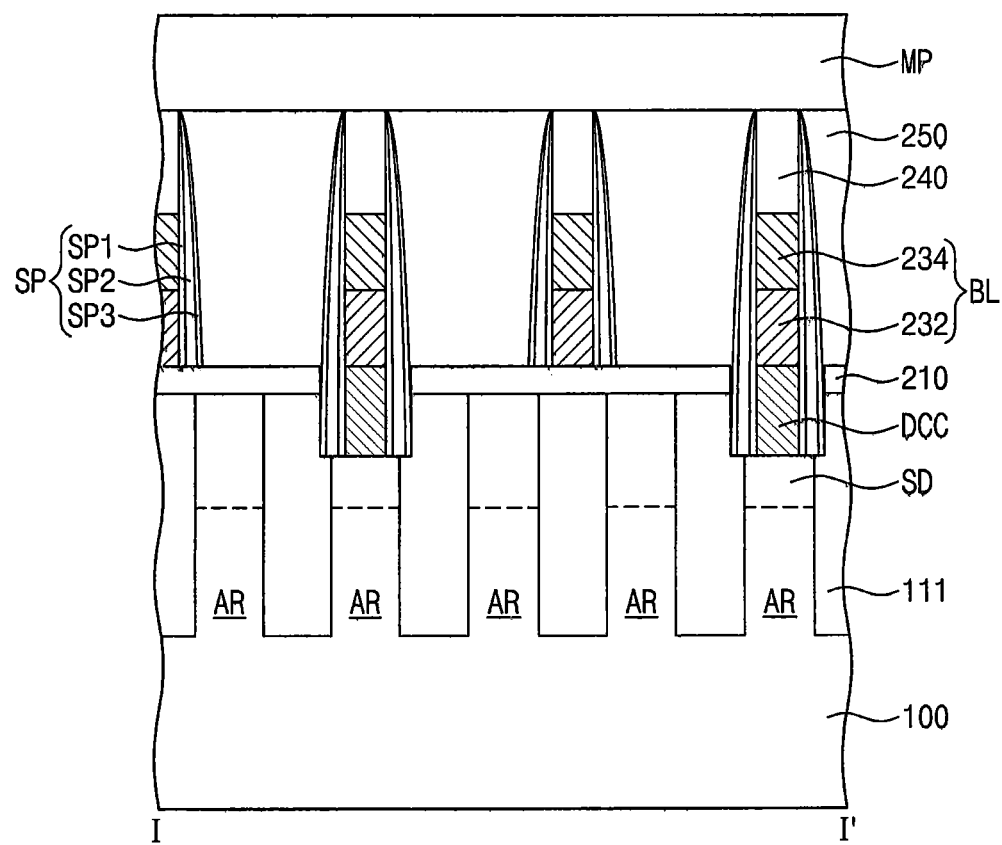
Figure 12C:
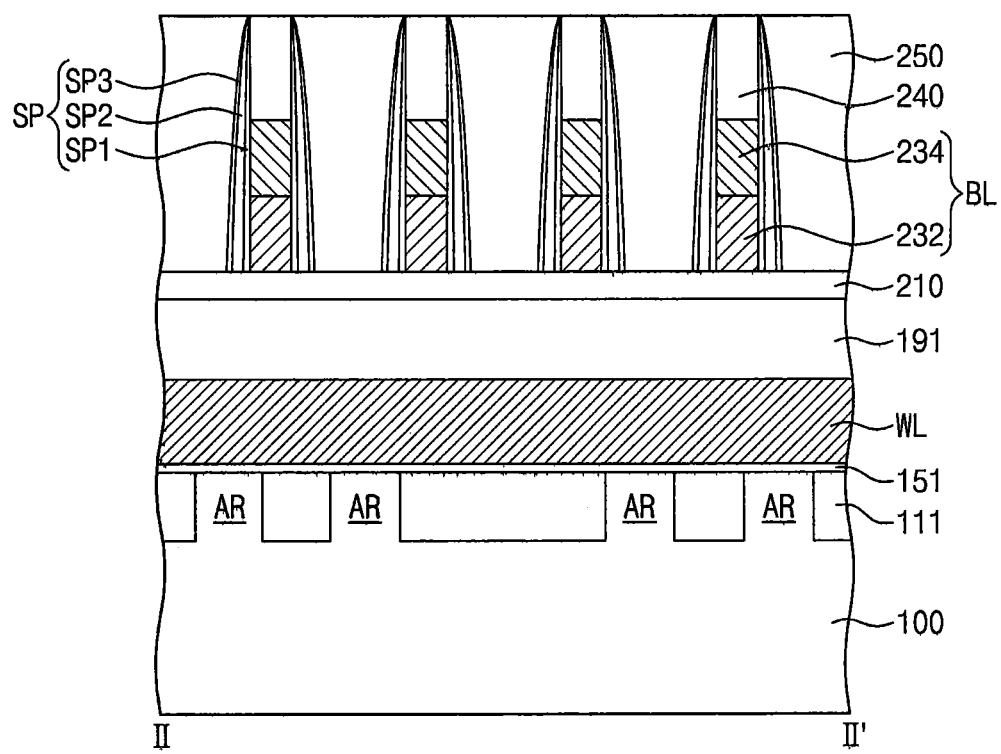
Figure 12D:
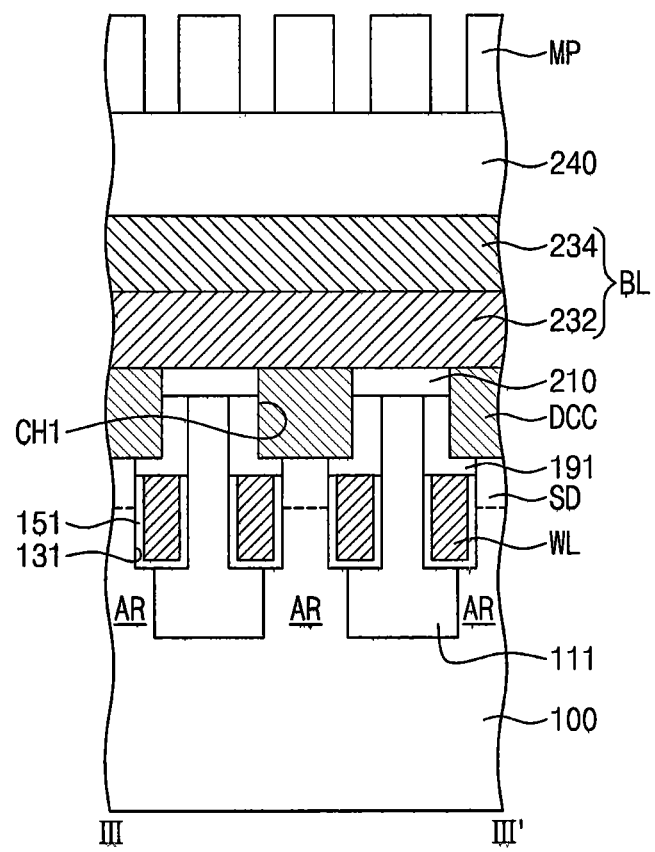
Figure 13A:
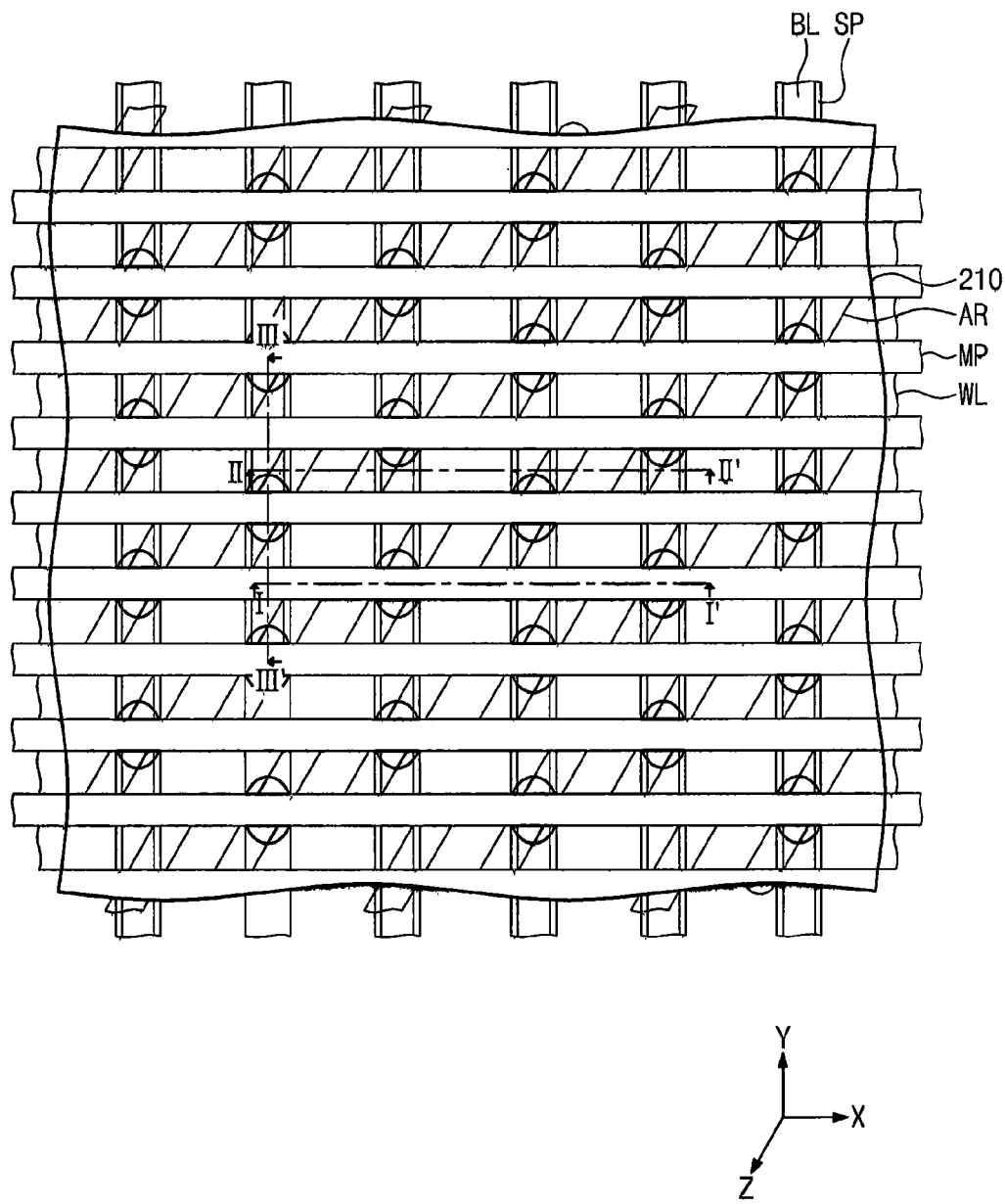
Figure 13B:
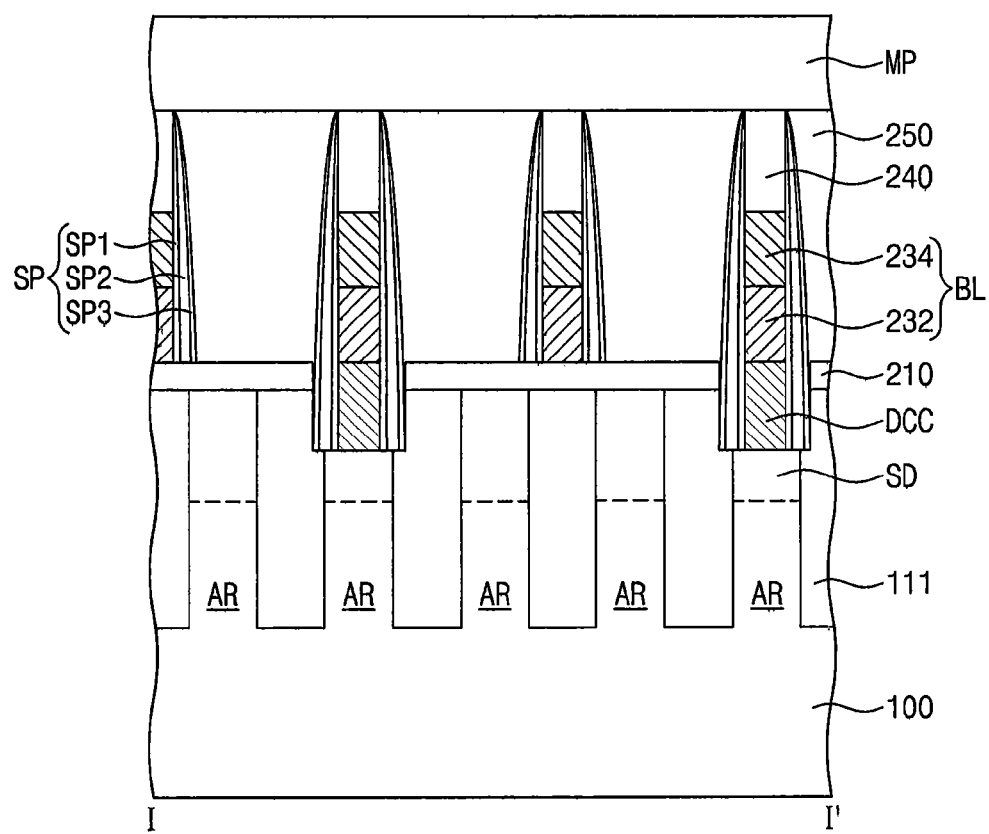
Figure 13C:
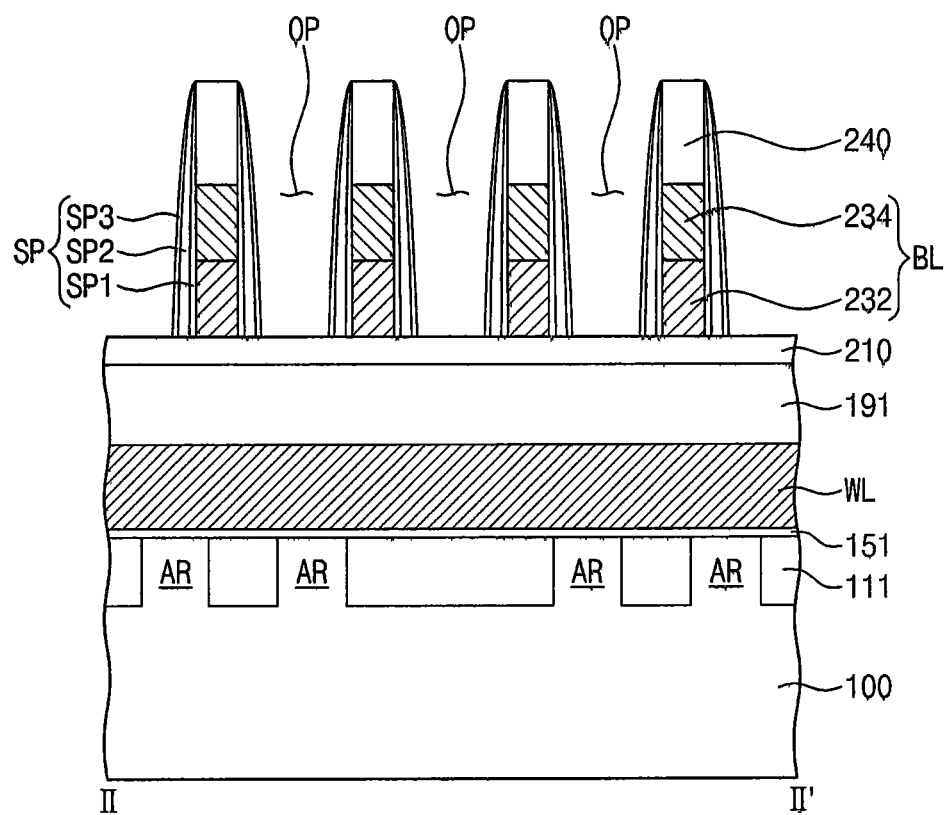
Figure 13D:
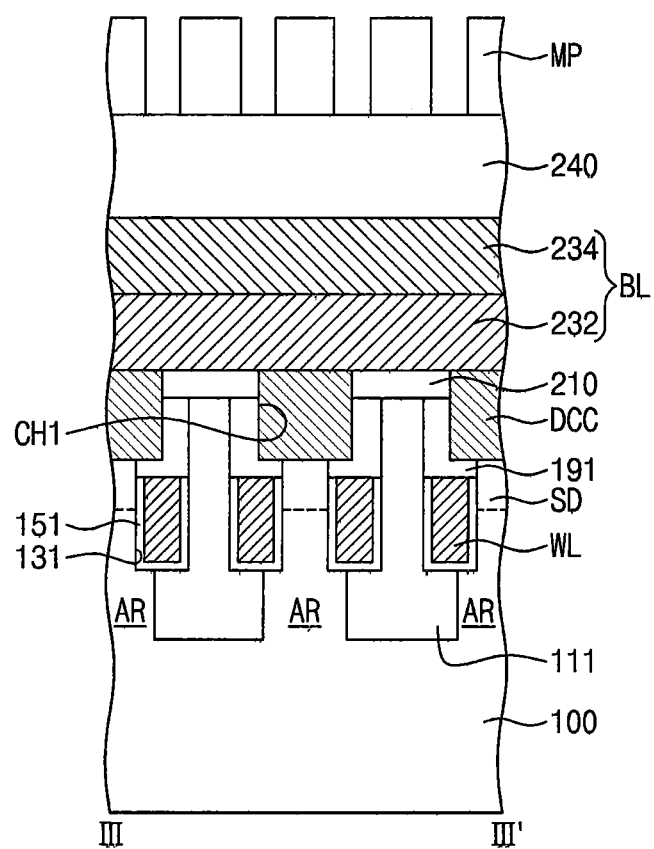
Figure 14A:
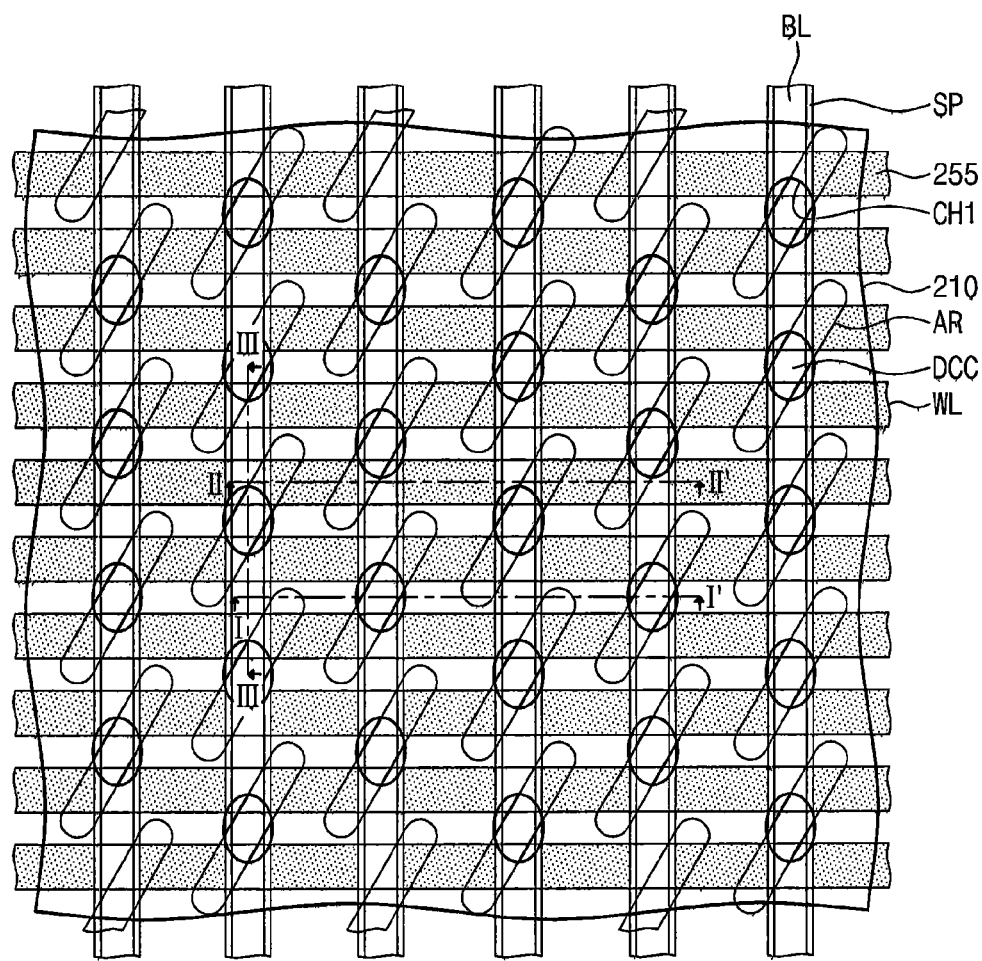
Figure 14B:
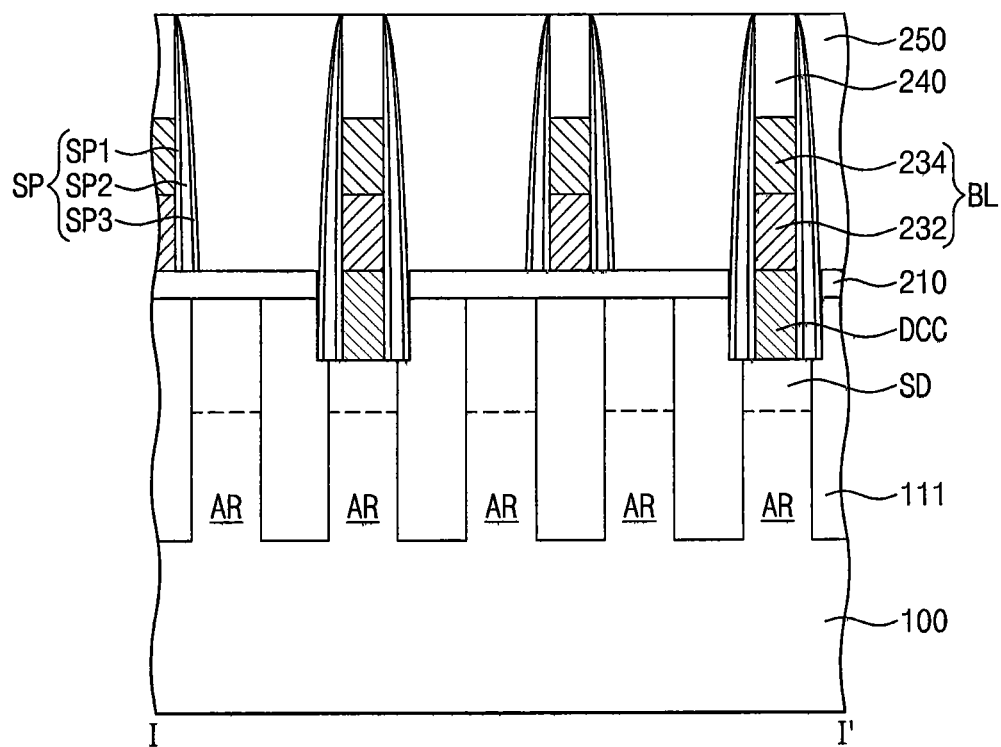
Figure 14C:
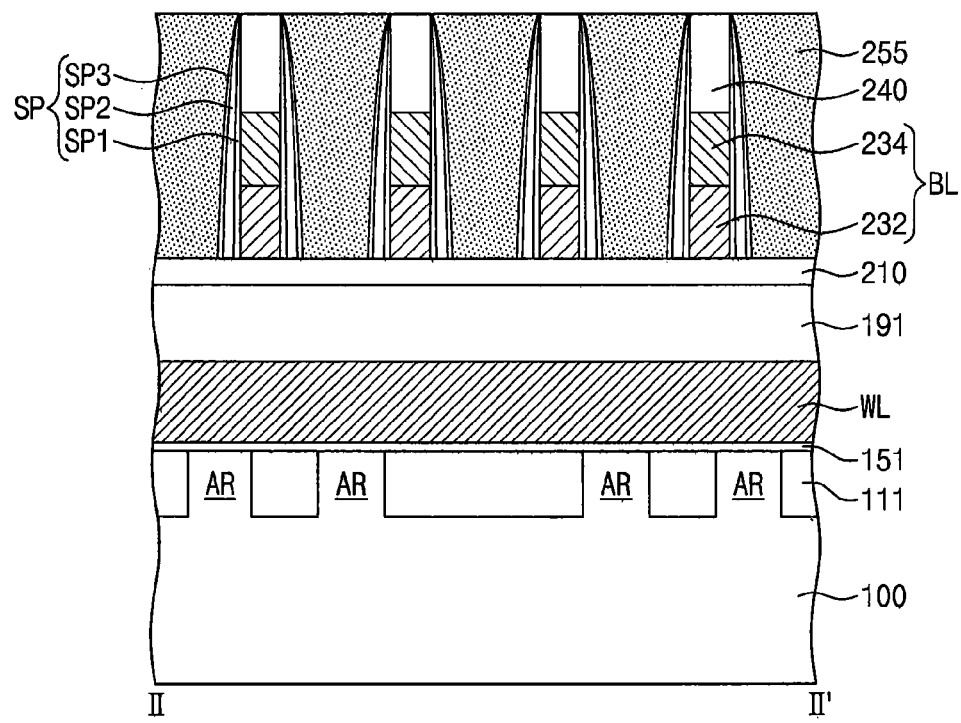
Figure 14D:
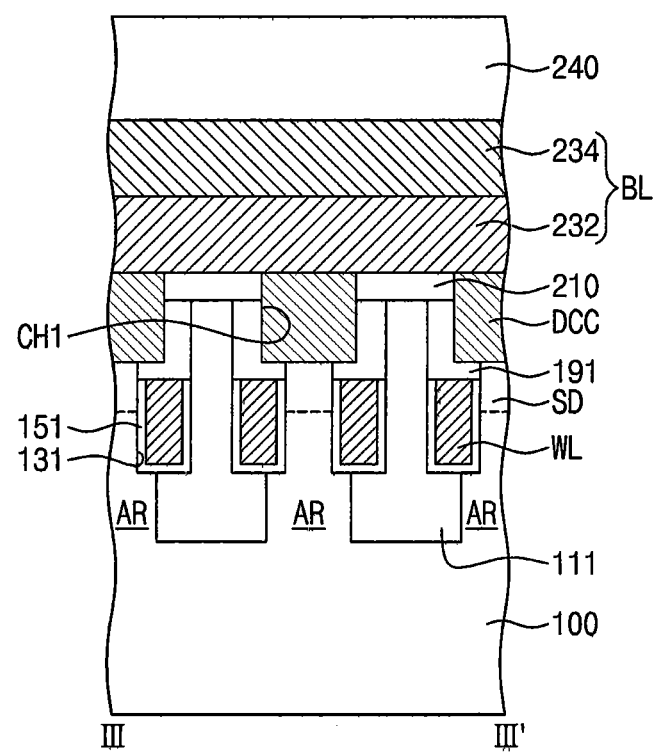
Figure 15A:
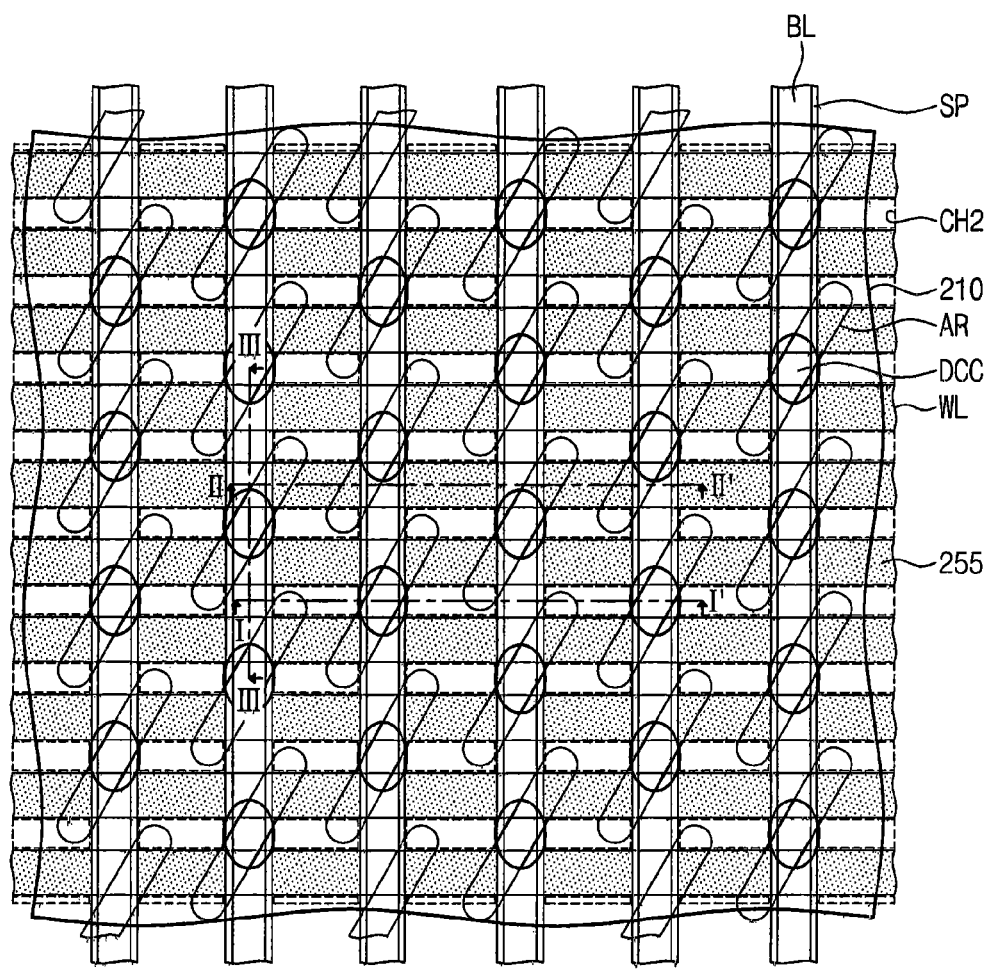
Figure 15B:
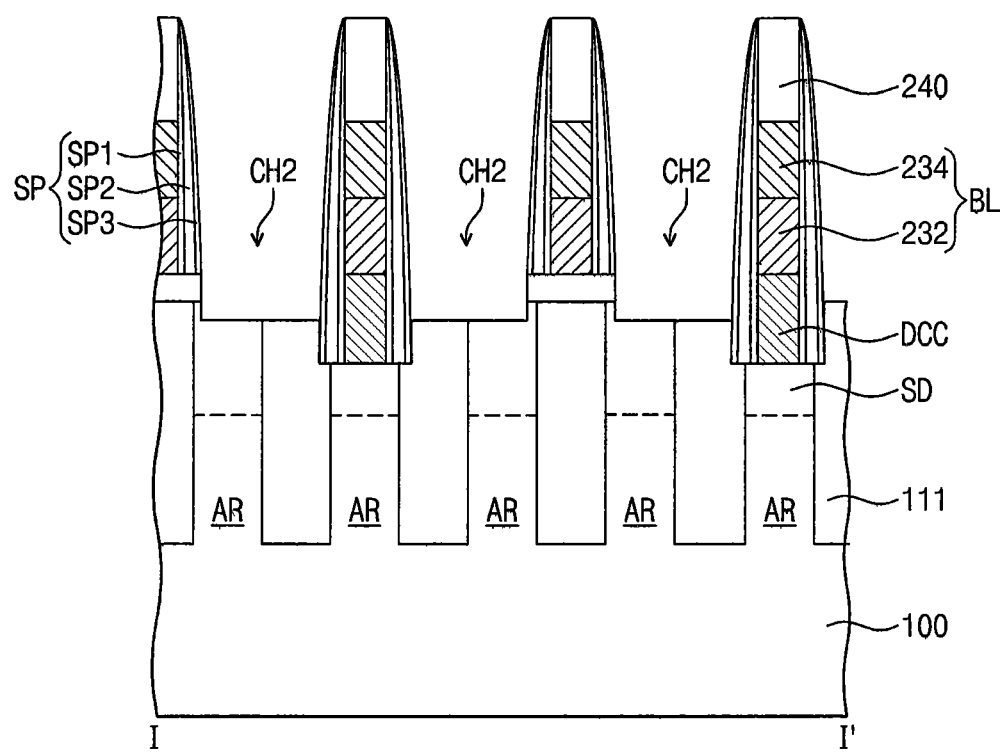
Figure 15C:
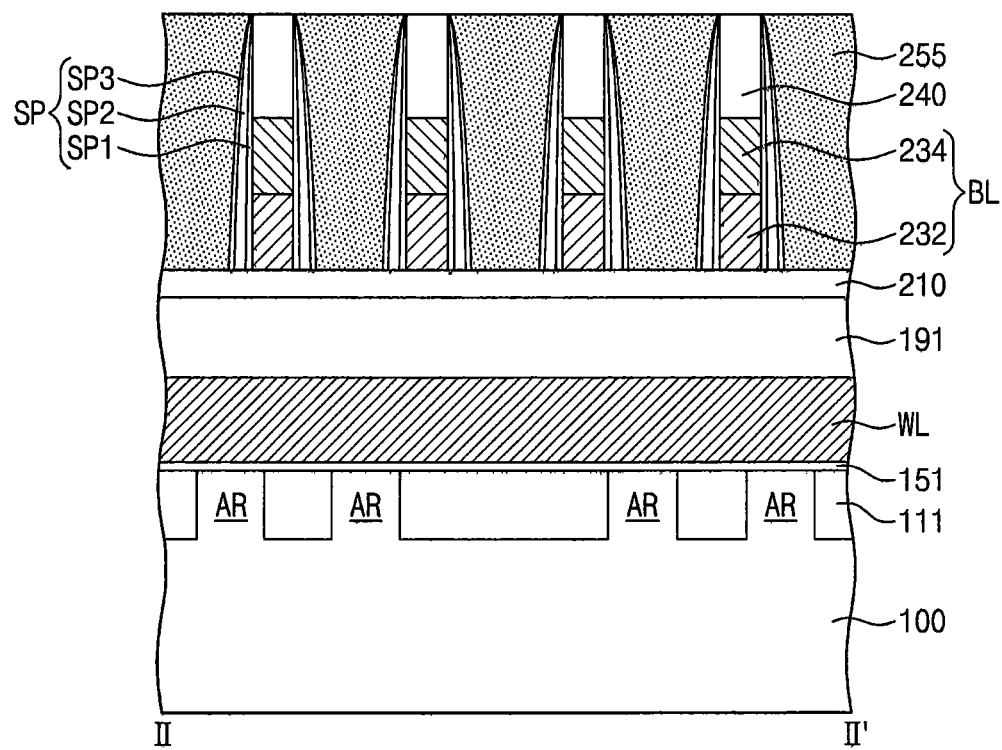
Figure 15D:
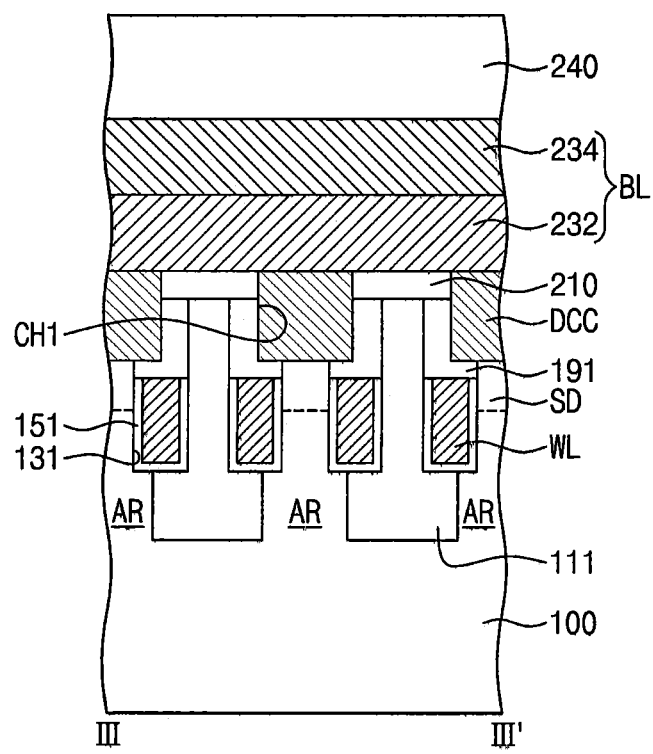
Figure 16A:
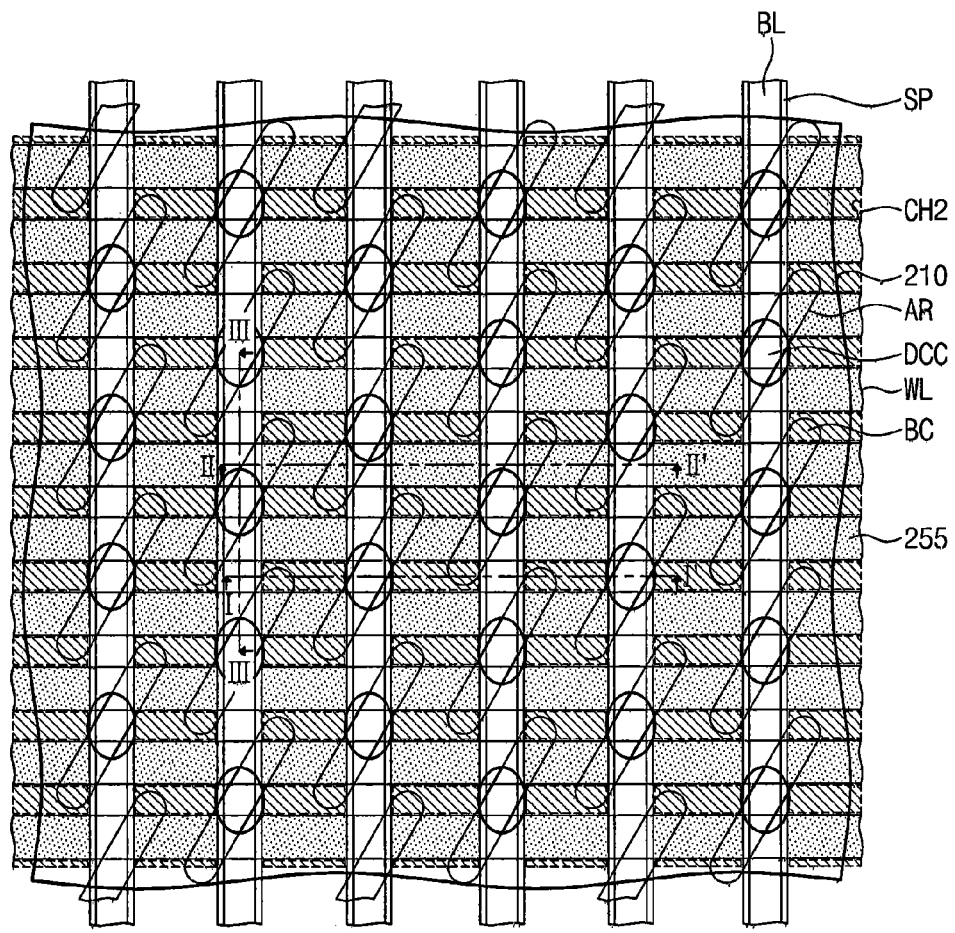
Figure 16B:
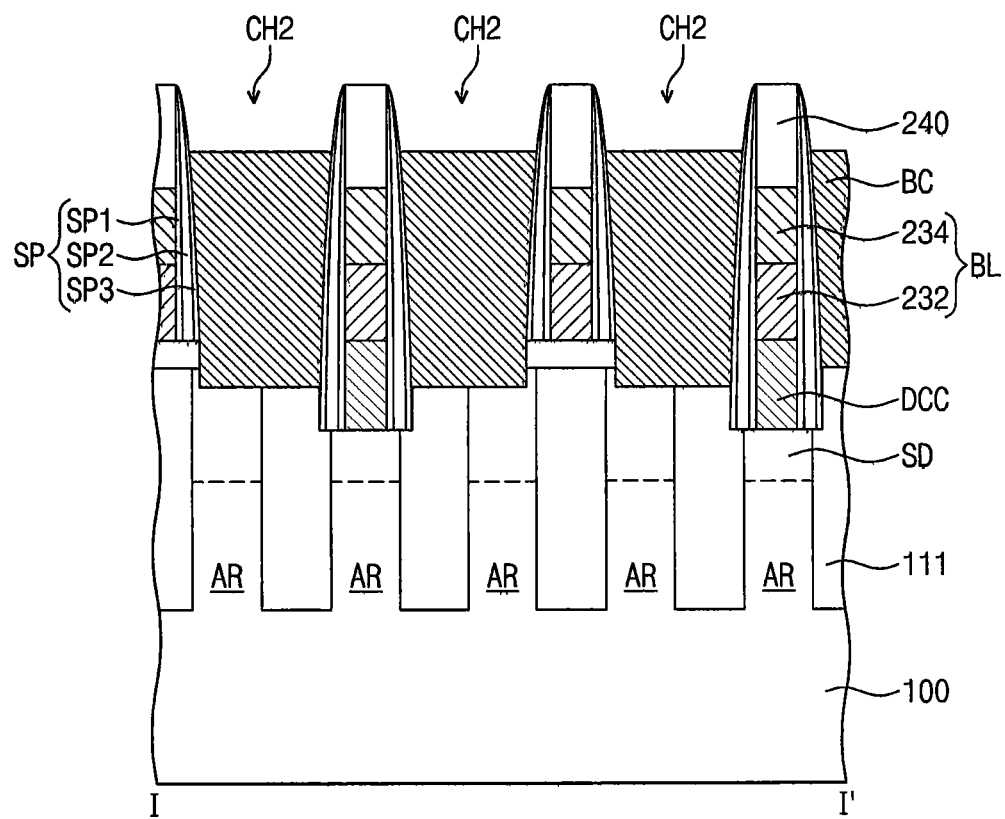
Figure 16C:
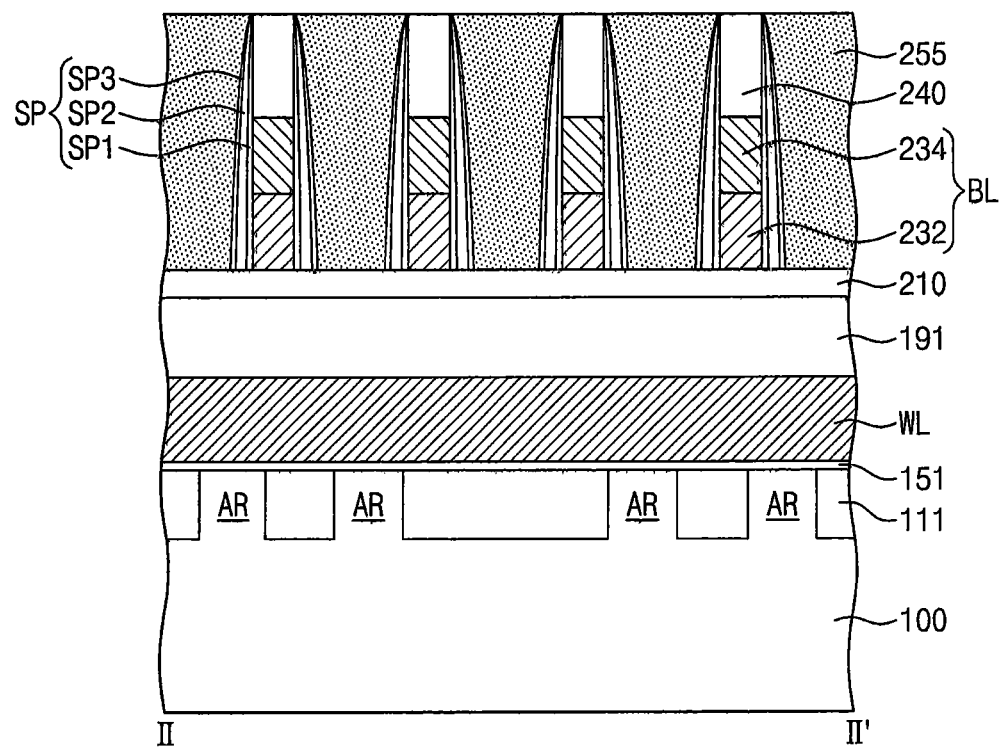
Figure 16D:
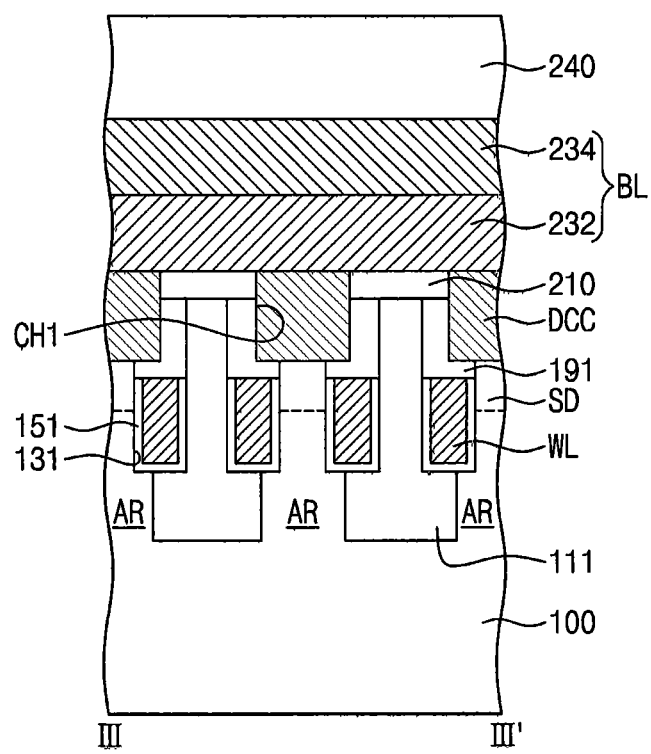
Figure 17A:
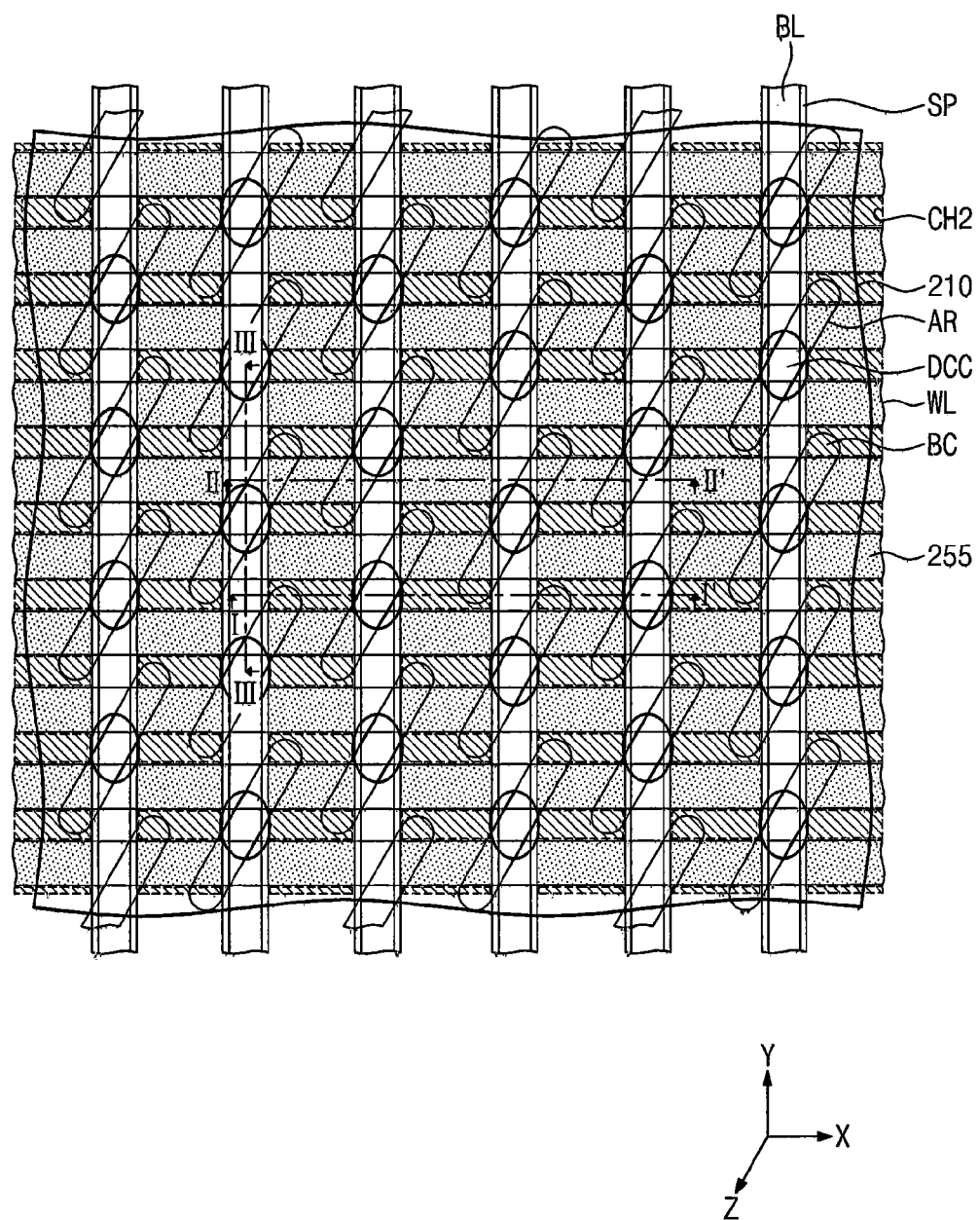
Figure 17B:
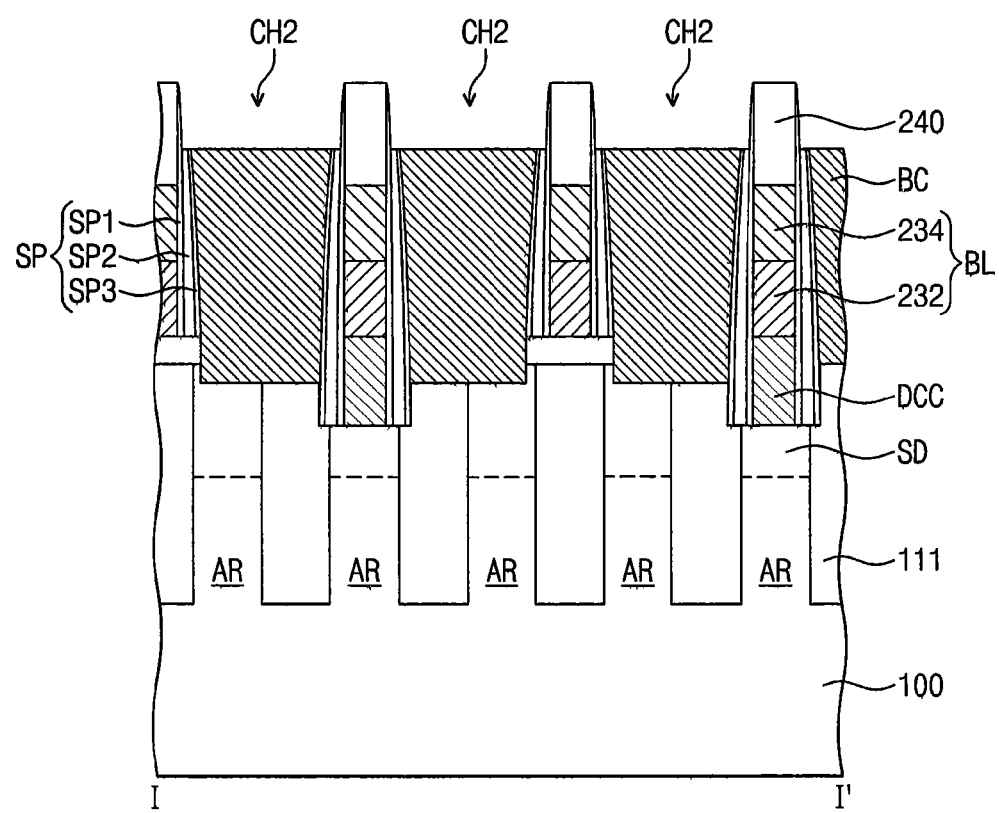
Figure 17C:
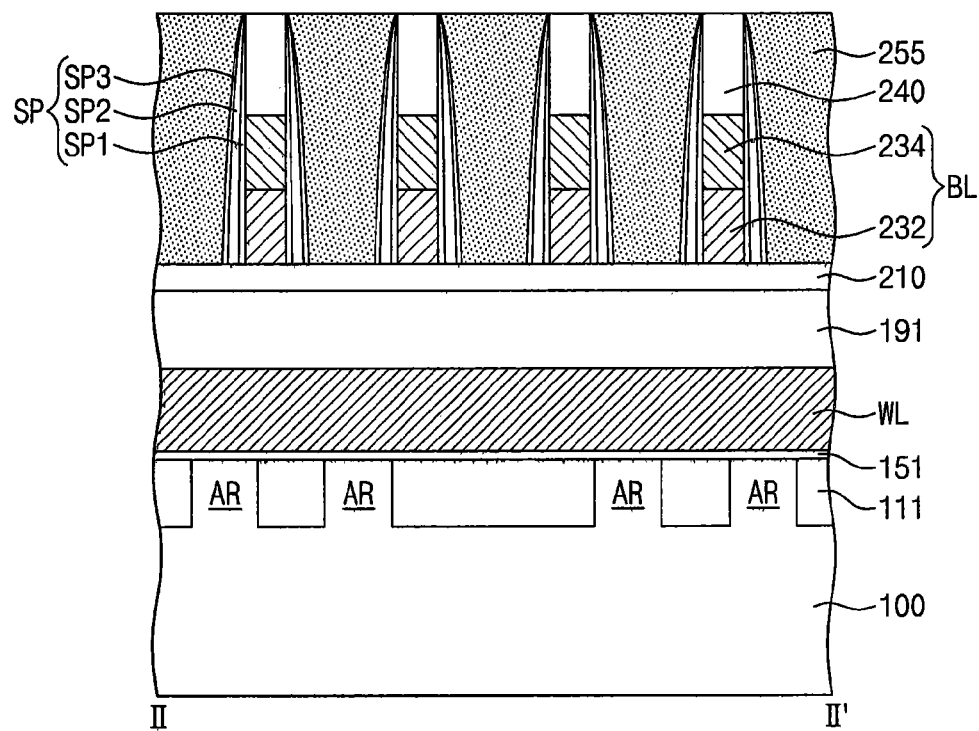
Figure 17D:
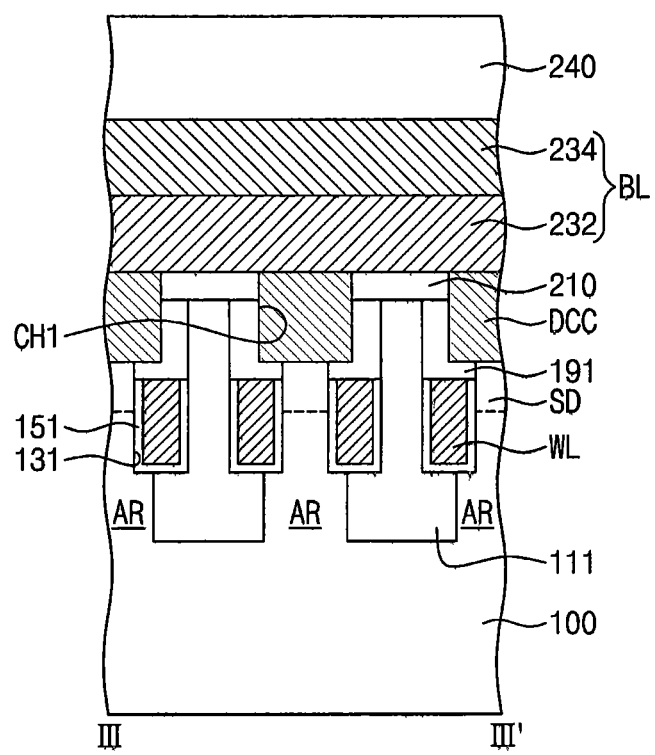

FIG. 1 is a perspective view of a semiconductor device according to example embodiments of the inventive concepts. FIG. 2 is a plan view of a semiconductor device according to example embodiments of the inventive concepts. FIGS. 3A to 3C are cross-sectional views taken along the lines I-I', II-II', and III-III' in FIG. 2, respectively. FIG. 4 is an enlarged view of the portion "A" in FIG. 3A.

Referring to FIGS. 1, 2, and 3A to 3C, device isolation layers 111 including an insulating material may be provided in a substrate 100. The device isolation layers 111 may define active regions AR. The active regions AR may be arranged in parallel to each other and each of the active regions AR may be a bar-shaped structure extending in a Z direction. Source/drain regions SD may be formed in the active regions AR.

Word lines WL may be disposed in the substrate 100 to cross the active regions AR in an X direction intersecting the Z direction. Two adjacent word lines WL may be provided to cross each of the active regions AR. The word lines WL may be arranged in a Y direction perpendicular to the X direction. The word lines WL may be buried in the substrate 100. For example, top surfaces of the word lines WL may be positioned at a level lower than a top surface of the substrate 100. A gate insulating layer 151 may be disposed between the word lines WL and the substrate 100. The gate insulating layer 151 may be provided to conformally cover bottom and side surfaces of the word lines WL. Capping patterns 191 may be disposed on the word lines WL and the gate insulating layer 151. Top surfaces of the capping patterns 191 may be positioned at the same level as that of the substrate 100. Bottom surfaces of the capping patterns 191 may be in contact with top surfaces of the word lines WL and the gate insulating layer 151.

First contact holes CH1 may be formed on the active regions AR and between the word lines WL. The first contact holes CH1 may be formed to penetrate a buffer layer 210 provided on the substrate 100 and thereby to expose the substrate 100. In some embodiments, the substrate 100 and the capping patterns 191 may be partially recessed during the formation of the first contact holes CH1. Bottom surfaces of the first contact holes CH1 may be positioned at a higher level than top surfaces of the word lines WL. Bit line node contacts DCC may be formed in the first contact holes CH1.

Bit lines BL may be disposed on the substrate 100 and may extend in a Y direction to cross the active regions AR. Each of the bit lines BL may be provided to be in contact with a plurality of the bit line node contacts DCC arranged in the Y direction. The bit lines BL may be parallel to each other. In some embodiments, the bit line node contacts DCC may have substantially the same width as the bit lines BL. Each of the bit lines BL may include a first conductive pattern 232 and a second conductive pattern 234, which are sequentially stacked on the substrate 100. The first conductive pattern 232 may be formed of or include, for example, polysilicon or doped polysilicon. The second conductive pattern 234 may be formed of or include at least one of, for example, tungsten (W), aluminum (Al), copper (Cu), nickel (Ni), or cobalt (Co). Although not shown in the drawings, a diffusion barrier layer (not shown) may be interposed between the first and second conductive patterns 232 and 234.

Insulating patterns 240 may be disposed on the bit lines BL. Similar to the bit lines BL, the insulating patterns 240 may extend in the Y direction to cross the active regions AR. The insulating patterns 240 may have substantially the same width as the bit lines BL. The insulating patterns 240 may be formed of or include, for example, silicon nitride (SiN).

Storage node contacts BC may be provided on both ends of the active regions AR. For example, each of the storage node contacts BC may be positioned between an adjacent pair of the bit lines BL. The storage node contacts BC may be provided to penetrate the buffer layer 210 between the bit lines BL and to be in contact with the source/drain regions SD. The storage node contacts BC may be provided in such a way that top surfaces thereof are positioned between top and bottom surfaces of the insulating patterns 240. The storage node contacts BC may be formed of or include at least one of, for example, metal silicides, polysilicon, metal nitrides, or metals.

When viewed from a plan view, isolation patterns 255 may be respectively disposed on regions, which are positioned between the bit lines BL and on the word lines WL. For example, the isolation patterns 255 may be provided between the bit lines BL and on the buffer layer 210. Bottom surfaces of the isolation patterns 255 may be in contact with a top surface of the buffer layer 210, and top surfaces thereof may be positioned at substantially the same level as top surfaces of the insulating patterns 240. The isolation patterns 255 may be formed of or include at least one of, for example, SiBCN, SiCN, SiOCN, or SiN.

Spacers SP may be disposed between the bit lines BL and the storage node contacts BC. The spacers SP may be interposed between the bit lines BL and the isolation patterns 255 and may extend in the Y direction. The spacers SP may be disposed to cover the sidewalls of the bit lines BL. The spacers SP may be extended to cover sidewalls of the bit line node contacts DCC and the insulating patterns 240.

Referring to FIGS. 3A and 4, each of the spacers SP may include an upper region UR with an upper sidewall, a lower region LR with a lower sidewall, and a top surface connecting the upper and lower sidewalls to each other. The upper region UR may have a width smaller than the lower region LR. In some embodiments, each of the spacers SP may include a first spacer SP1, a second spacer SP2, and a third spacer SP3. A portion of a sidewall of the first spacer SP1 may serve as the upper sidewall of the upper region UR, and at least a portion of a sidewall of the third spacer SP3 may serve as the lower sidewall of the lower region LR. Top surfaces TS1 and TS2 of the second and third spacers SP2 and SP3 may serve as the top surface connecting the upper and lower sidewalls.

More specifically, the first spacer SP1 may be provided to cover sidewalls of the bit line node contacts DCC, the first and second conductive patterns 232 and 234, and the insulating patterns 240. The second spacer SP2 may be provided to cover a portion of the sidewall of the first spacer SP1. A top surface TS1 of the second spacer SP2 may be positioned between the top and bottom surfaces of the insulating patterns 240. That is, the top surface TS1 of the second spacer SP2 may be positioned at a level that is lower than the top surface of the insulating patterns 240 and is higher than the bottom surface of the insulating patterns 240. In some embodiments, the top surface TS1 of the second spacer SP2 may be positioned at the same level as a top surface of the storage node contact BC. In this case, the upper sidewall of the first spacer SP1 may be partially exposed by the second spacer SP2.

The third spacer SP3 may be provided to cover a sidewall of the second spacer SP2. The top surface TS2 of the third spacer SP3 may be positioned at substantially the same level as that of the second spacer SP2. In some embodiments, the top surface TS2 of the third spacer SP3 may be positioned at substantially the same level as that of the storage node contact BC. A portion of the upper sidewall of the first spacer SP1 may be spaced apart from the storage node contact BC, and a sidewall of the third spacer SP3 may be in contact with the storage node contact BC and the isolation patterns 255. The first spacer SP1 may include a material having an etch selectivity with respect to the second and third spacers SP2 and SP3. The first spacer SP1 may be formed of or include a low-k dielectric, whose dielectric constant is lower than that of the third spacer SP3. For example, the first spacer SP1 may be formed of or include at least one of, for example, SiBCN, SiBN, SiOCN, or SiN. Furthermore, the second spacer SP2 may be formed of or include a material having an etch selectivity with respect to the third spacer SP3 and the isolation patterns 255. For example, the second spacer SP2 may be formed of or include silicon oxide ($SiO_2$). The third spacer SP3 may be formed of or include a material having an etch selectivity with respect to the isolation patterns 255. For example, the third spacer SP3 may include silicon nitride (SiN).

Landing pads LP may be disposed on the storage node contacts BC, respectively. The landing pads LP may be provided to cover the top surfaces of the storage node contacts BC and the second and third spacers SP2 and SP3 as well as the upper sidewall of the first spacer SP1 that is not covered with the second and third spacers SP2 and SP3. Accordingly, the upper portion of the first spacer SP1 may be interposed between the landing pads LP and the bit lines BL. The upper portion of the first spacer SP1 may have a width smaller than those of other portion of the spacer SP positioned between the bit lines BL and the isolation patterns 255. The lowermost surface of the landing pad LP may be in contact with the top surface of the storage node contact BC and the top surfaces TS1 and TS2 of the second and third spacers SP2 and SP3. An outer sidewall of the landing pad LP may be in contact with the upper portion of the first spacer SP1. The lowermost surface of the landing pad LP may have a width or area greater than that of the top surface of the storage node contact BC.

Contact plugs 260 may be disposed on the landing pads LP, respectively. The contact plugs 260 may be positioned between the insulating patterns 240 and between the isolation patterns 255, when viewed in a plan view. The contact plug 260 may include an upper portion protruding above the insulating patterns 240. A second interlayer dielectric 265 may be further provided on the insulating patterns 240. The second interlayer dielectric 265 may be disposed between the contact plugs 260.

Memory elements may be disposed on the contact plugs 260, respectively. In some embodiments, each of the memory elements may be or include, for example, a capacitor. The capacitor may include a bottom electrode BE, a dielectric layer (not shown), and a top electrode (not shown).

FIGS. 5A to 17A are plan views illustrating a method of fabricating a semiconductor device according to example embodiments of the inventive concepts. FIGS. 5B to 17B are cross-sectional views taken along the lines I-I' in FIGS. 5A to 17A. FIGS. 5C to 17C are cross-sectional views taken along the lines II-II' in FIGS. 5A to 17A, respectively. FIGS. 5D to 17D are cross-sectional views taken along the lines III-III' in FIGS. 5A to 17A, respectively.

Referring to FIGS. 5A to 5D, device isolation layers 111 may be formed in a substrate 100 to define active regions AR. The formation of the device isolation layer 111 may include forming trenches (not shown) on the substrate 100 and filling the trenches with an insulating material. The active regions AR may be arranged in parallel to each other and each of the active regions AR may be a bar-shaped structure extending in a Z direction. The substrate 100 may be, for example, a silicon-on-insulator (SOI) substrate, a germanium substrate, a germanium-on-insulator (GOI) substrate, a silicon-germanium substrate, or a substrate including an epitaxial layer formed by a selective epitaxial growth (SEG) process. The device isolation layers 111 may be formed of or include, for example, silicon oxide, silicon nitride, or silicon oxynitride.

Referring to FIGS. 6A to 6D, source/drain regions SD may be formed in the active regions AR. For example, the formation of the source/drain regions SD may include forming an ion implantation mask (not shown) on the substrate 100 and performing an ion implantation process on the substrate 100 therewith.

Trenches 131 may be formed in the substrate 100. As an example, a pair of trenches 131 may be formed to cross each of the active regions AR in an X direction. The trenches 131 may be formed parallel to each other in a Y direction crossing the X direction. A gate insulating layer 151 may be formed to conformally cover the trenches 131. Word lines WL may be formed on the gate insulating layer 151 to fill the trenches 131. The gate insulating layer 151 may be formed of or include an insulating material (e.g., a thermal oxide layer). The word lines WL may be formed of or include a conductive material (e.g., at least one of polysilicon, doped polysilicon, metals, or metal silicides).

The gate insulating layer 151 and the word lines WL may be removed from upper regions of the trenches 131, and then, capping patterns 191 may be formed in the trenches 131. The capping patterns 191 may be formed on the word lines WL to fill the upper regions of the trenches 131. The capping patterns 191 may be formed of or include at least one of, for example, silicon oxide, silicon nitride, or silicon oxynitride.

Referring to FIGS. 7A to 7D, a buffer layer 210 may be formed on the substrate 100. The buffer layer 210 may be formed of or include at least one insulating layer. For example, the buffer layer 210 may be formed of or include at least one of a silicon oxide layer, a silicon nitride layer, or a silicon oxynitride layer. A mask pattern (not shown) may be formed on the buffer layer 210 to expose a portion of the buffer layer 210.

An etching process may be performed on the buffer layer 210, using the mask pattern as an etch mask. A portion of the buffer layer 210 and an upper portion of the substrate 100 may be etched by the etching process, and thus, first contact holes CH1 may be formed on the active regions AR. For example, when viewed in a plan view, a pair of the first contact holes CH1 may be formed to expose the source/drain regions SD formed in each of the active region AR. In some embodiments, the formation of the first contact holes CH1 may be performed to etch upper portions of the device isolation layers 111 adjacent to the source/drain regions SD.

Referring to FIGS. 8A to 8D, contact patterns 215 may be formed in the first contact holes CH1, respectively. For example, each of the contact patterns 215 may be formed to fill a corresponding one of the first contact holes CH1. The formation of the contact patterns 215 may include forming a conductive layer (not shown) on the buffer layer 210 and performing a planarization process on the conductive layer. In some embodiments, the planarization process may be performed using, for example, a chemical mechanical polishing (CMP) process or an etch-back process, to expose a top surface of the buffer layer 210. The contact patterns 215 may be formed of or include at least one of metal silicides, polysilicon, metal nitrides, and metals.

Referring to FIGS. 9A to 9D, an electrode layer 230 may be formed on the buffer layer 121 and the contact patterns 215. The electrode layer 230 may include a plurality of conductive layers. For example, the electrode layer 230 may include a first electrode layer 231 and a second electrode layer 233 that are sequentially stacked on the buffer layer 210. The first electrode layer 231 may include, for example, polysilicon or doped polysilicon. The second electrode layer 233 may include, for example, tungsten (W), aluminum (Al), copper (Cu), nickel (Ni), or cobalt (Co). Although not shown in the drawings, a diffusion barrier layer may be disposed between the first electrode layer 231 and the second electrode layer 233. The diffusion barrier layer may be formed of or include a metallic layer (e.g., of TiN, Ti/TiN, TaN, or WN) capable of preventing diffusion from occurring.

Referring to FIGS. 10A to 10D, insulating patterns 240 may be formed on the electrode layer 230. The insulating patterns 240 may extend parallel to each other in the Y direction and may be arranged in an X direction. Each of the insulating patterns 240 may be formed on the contact patterns 215 arranged in the Y direction to cross the active regions AR in the Y direction. The insulating patterns 240 may be formed of or include silicon oxide or silicon nitride.

The electrode layer 230 exposed by the insulating patterns 240 may be etched to form bit lines BL. In the case where the electrode 230 includes a plurality of conductive layers, each of the bit lines BL may include a first conductive pattern 232 and a second conductive pattern 234 that are sequentially stacked on the substrate 100. The contact patterns 215 may be etched using the insulating patterns 240 as an etch mask to form bit line node contacts DCC in the first contact holes CH1. The bit lines BL may be arranged in the X direction, and each of them may be formed to cross a plurality of the bit line node contacts DCC arranged in the Y direction. The bit line node contacts DCC may be formed to partially expose not only the buffer layer 210 but also the active regions AR and the device isolation layers 111 exposed through the first contact holes CH1.

Referring to FIGS. 11A to 11D, spacers SP may be formed to cover sidewalls of the insulating patterns 240, the bit lines BL, and the bit line node contacts DCC. In some embodiments, each of the spacers SP may include first to third spacers SP1, SP2, and SP3. The first spacer SP1 may be formed to cover sidewalls of the insulating patterns 240, the bit lines BL, and the bit line node contacts DCC. The second spacer SP2 may be formed on the first spacer SP1. The third spacer SP3 may be formed on the second spacer SP2. The formation of the spacers SP may include sequentially forming a first insulating layer (not shown), a second insulating layer (not shown), and a third insulating layer (not shown) on the buffer layer 210 and then performing an etch-back process on the first to third insulating layers (for example, to expose the top surfaces of the buffer layer 210 and the insulating patterns 240). In some embodiments, the spacers SP may include lower portions, which are provided between the first contact holes CH1 and the bit line node contacts DCC to fill empty regions of the first contact holes CH1. The first spacer SP1 may be formed of a material having an etch selectivity with respect to the second and third spacers SP2 and SP3. For example, the first spacer SP1 may be formed of or include at least one of SiBCN, SiBN, SiOCN, or SiN. The second spacer SP2 may be formed of a material having an etch selectivity with respect to the third spacer SP3. For example, the second spacer SP2 may include silicon oxide (SiO$_2$). The third spacer SP3 may include, for example, silicon nitride (SiN).

Referring to FIGS. 12A to 12D, a first interlayer dielectric 250 may be formed on the buffer layer 210. The first interlayer dielectric 250 may be formed between the bit lines BL to cover the top surface of the buffer layer 210. The first interlayer dielectric 250 may be planarized to expose the top surfaces of the insulating patterns 240. The first interlayer dielectric 250 may be formed of or include at least one of, for example, a silicon oxide layer, a silicon nitride layer, or a silicon oxynitride layer.

Mask patterns MP may be formed on the first interlayer dielectric 250. The mask patterns MP may be formed on the bit line node contacts DCC arranged to extend in the X direction and to cross the bit lines BL. The mask patterns MP may be formed of a material having an etch selectivity with respect to the first interlayer dielectric 250 and the third spacer SP3. For example, the mask patterns MP may be a spin-on-hard mask (SOH).

Referring to FIGS. 13A to 13D, portions of the first interlayer dielectric 250 exposed by the mask patterns MP may be etched to form openings OP. For example, the formation of the openings OP may include partially removing the first interlayer dielectric 250 using a wet etching process or a dry etching process. After the formation of the openings OP, the mask patterns MP may be removed.

Referring to FIGS. 14A to 14D, isolation patterns 255 may be formed to fill the openings OP. For example, the isolation patterns 255 may be formed to fill regions defined by the bit lines BL and the first interlayer dielectric 250. The isolation patterns 255 may be formed to have top surfaces that are substantially coplanar with those of the insulating patterns 240. The isolation patterns 255 may be formed of a material having an etch selectivity with respect to the first interlayer dielectric 250 and the second and third spacers SP2 and SP3. For example, the isolation patterns 255 may be formed of or include at least one of SiBCN, SiCN, SiOCN, or SiN.

Referring to FIGS. 15A to 15D, after the formation of the isolation patterns 255, the first interlayer dielectric 250 may be removed to form second contact holes CH2 defined by the bit lines BL and the isolation patterns 255. For example, the second contact holes CH2 may be formed to expose opposite ends of each of the active regions AR. In some embodiments, the removal of the first interlayer dielectric 250 may be performed to etch a portion of the buffer layer 210 and thereby to expose the source/drain regions SD of the active regions AR. Furthermore, the second contact holes CH2 may be formed to expose the sidewall of the third spacer SP3. In the case where the removal of the first interlayer dielectric 250 is performed in an over-etch manner, upper portions of the active regions AR and the device isolation layers 111 may be further etched to have a recessed profile. In this case, each of the second contact holes CH2 may have a width larger than that of a portion of the active region AR exposed by the second contact hole CH2.

Referring to FIGS. 16A to 16D, storage node contacts BC may be formed in the second contact holes CH2, respectively. The storage node contacts BC may be formed to be in contact with the source/drain regions SD, respectively. Each of the storage node contacts BC may be formed to partially fill a corresponding one of the second contact holes CH2. The formation of the storage node contacts BC may include forming a conductive layer (not shown) to fill the second contact holes CH2 and performing an etching process (e.g., etch-back process) on the conductive layer. The storage node contacts BC may be formed to have top surfaces that are positioned at a level lower than those of the insulating patterns 240. Accordingly, upper portions of the spacers SP may be exposed by the storage node contacts BC. To put it another way, the storage node contacts BC may be formed to expose an upper sidewall of the third spacer CP3. The storage node contacts BC may be formed of or include at least one of, for example, metal polysilicon, metal nitrides, and metals.

Referring to FIGS. 17A to 17D, an etching process may be performed to etch an upper portion of the spacer SP exposed by the storage node contact BC. For example, a selective etching process may be performed to etch the exposed upper portion of the third spacer SP3. The selective etching process may be performed using a wet or dry etching technique. In the case where a wet etching technique is used, the selective etching process on the third spacer SP3 may be performed using etchant containing phosphoric acid ($H_3PO_4$). In some embodiments, since the isolation patterns 255 have an etch selectivity with respect to the third spacer SP3, it may be possible to prevent the isolation patterns 255 from being etched during the selective etching process on the third spacer SP3.

As a result of the partial removal of the third spacer SP3, an upper portion of the second spacer SP2 may be exposed. The exposed upper portion of the second spacer SP2 may be selectively etched to expose an upper sidewall of the first spacer SP1 at the upper portion of the storage node contacts BC. The exposed upper portion of the second spacer SP2 may be removed by a wet or dry etching process. In the case where the exposed upper portion of the second spacer SP2 is removed by the wet etching process, buffered oxidant etchant (BOE), hydrofluoric acid (HF), or LAL solution (e.g., containing HF and $NH_4F$) may be used as an etchant. It may be possible to prevent the first spacer SP1 and the isolation patterns 255 from being etching during the etching of the exposed upper portion of the second spacer SP2, because the first spacer SP1 and the isolation patterns 255 have an etch selectivity with respect to the second spacer SP2.

Returning to FIGS. 2, 3A to 3C, and 4, landing pads LP may be formed in the second contact holes CH2, respectively. For example, the landing pads LP may be formed to conformally cover the top surfaces of the storage node contacts BC, top surfaces TS1 and TS2 of the second and third spacers SP2 and SP3, and the upper sidewall of the first spacer SP1. The landing pads LP may be formed of or include at least one of, for example, polysilicon, silicon oxynitride, metals, or metal silicides.

Contact plugs 260 may be formed on the landing pads LP, respectively. The formation of the contact plugs 260 may include forming a conductive layer (not shown) to fill the upper regions of the contact holes CH2 and then patterning the conductive layer with an etch mask (not shown). The contact plugs 260 may be formed to fill the upper regions of the second contact holes CH2 and protrude above the top surface of the insulating patterns 240. The contact plugs 260 may be formed of, for example, a conductive material.

A second interlayer dielectric 265 may be formed between the contact plugs 260. The second interlayer dielectric 265 may be formed of or include at least one of, for example, a silicon oxide layer, a silicon nitride layer, or a silicon oxynitride layer.

Memory elements (e.g., capacitors) may be formed on the contact plugs 260, respectively. The capacitor may include a bottom electrode BE, a dielectric layer (not shown), and a top electrode (not shown).

As the bit lines become narrower and narrower, it may be necessary to reduce a thickness of an insulating layer interposed between the bit lines. However, this may lead to an increase in parasitic capacitance between the bit lines. Furthermore, as storage node contacts become narrower and narrower, a contact area between the storage node contact and the landing pad decreases, and this may lead to deterioration in electrical characteristics of a semiconductor device. A spacer formed on sidewalls of the bit lines may be partially removed, and this may make it possible to increase a contact area between the storage node contact and the landing pad. However, in the case where the spacer includes the same material as isolation patterns, the isolation patterns may be etched along with the spacer, and this may lead to a reduction in width of the isolation patterns or unintended removal of the isolation patterns. In this case, the semiconductor device may include defects, for example, an electric short circuit or an unintended conductive bridge formed between adjacent ones of the bit line node contacts, which are separated from each other by the isolation patterns, and/or between adjacent ones of the contact plugs, which will be formed in a subsequent process.

According to example embodiments of the inventive concepts, the first spacer SP1 and the isolation patterns 255 may be formed of a low-k dielectric material, whose dielectric constant is lower than that of the third spacer SP3. This may make it possible to reduce a parasitic capacitance between the bit lines BL. In addition, the isolation patterns 255 may be formed of a material having an etch selectivity with respect to the second and third spacers SP2 and SP3. Thus, although the second and third spacers SP2 and SP3 are partially etched, it may be possible to prevent the isolation patterns 255 from being etched.

Figure 18:
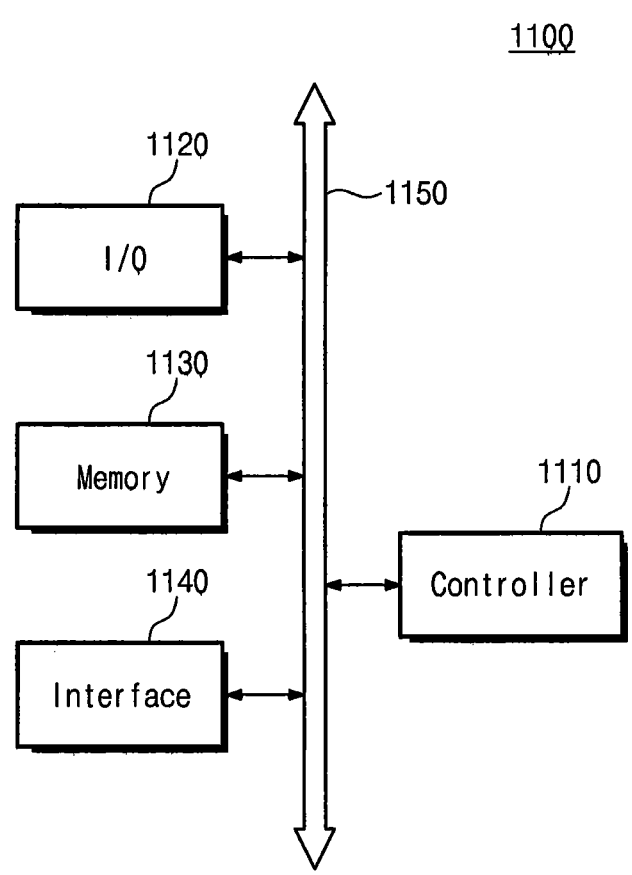
FIG. 18 is a block diagram illustrating an electronic system according to example embodiments of the inventive concepts.

FIG. 18 is a block diagram illustrating an electronic system 1100 according to example embodiments of the inventive concepts.

As illustrated, the electronic system 1100 may include a controller 1110, an input/output device (I/O) 1120, a memory device 1130, an interface 1140, and a bus 1150. The controller 1110, the input/output device 1120, the memory device 1130, and/or the interface 1140 may be connected to each other through the bus 1150. The bus 1150 may be a path through which data migrate. The controller 1110, the input/output device 1120, the memory device 1130, and/or the interface 1140 may include a semiconductor device according to example embodiments of the inventive concepts.

The controller 1100 may include at least one of a microprocessor, a digital signal processor, a microcontroller or logic elements capable of performing the same functions as those of the above elements. The input/output device 1120 may include a keypad, a keyboard, a display device or the like. The memory device 1130 may store data and/or a command. The interface 1140 may serve to transmit/receive data to/from a communication network. The interface 1140 may be in a wired or wireless form. For example, the interface 1140 may include an antenna or a wired/wireless transceiver. Although not shown in the figure, the electronic system 1100 may further include a high-speed DRAM device and/or an SRAM device as a working memory device to improve an operation of the controller 1110.

The electronic system 1100 may be applied to a personal digital assistant (PDA), a portable computer, a web tablet, a wireless phone, a mobile phone, a digital music player, a memory card or any electronic device that can transmit and/or receive data in a wireless environment.

Figure 19:
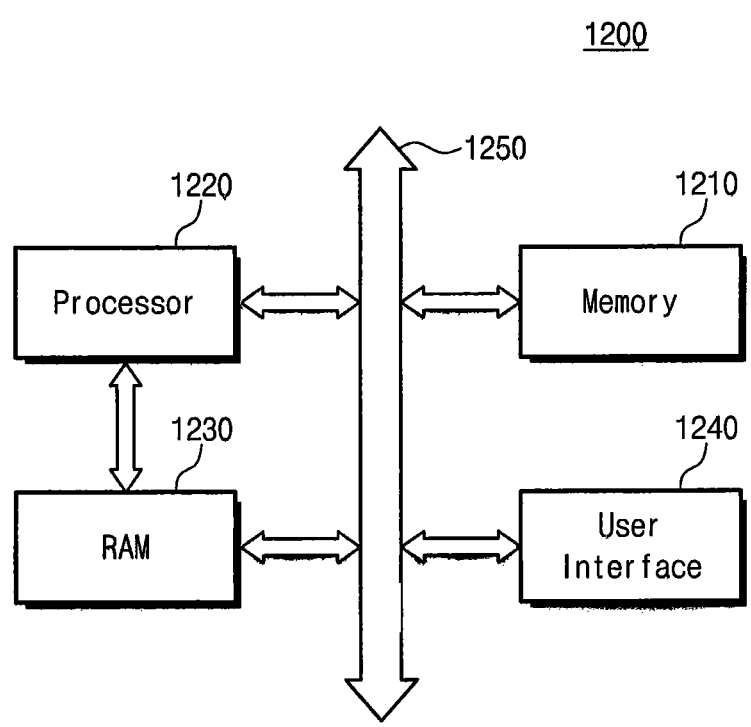
FIG. 19 is a block diagram illustrating an electronic system according to example embodiments of the inventive concepts.

FIG. 19 is a block diagram illustrating an electronic system 1200 according to example embodiments of the inventive concepts.

The electronic system 1200 may include at least one semiconductor device according to example embodiments of the inventive concepts. The electronic system 1200 may include a mobile device, a computer or the like. For example, the electronic system 1200 may include a memory system 1210, a processor 1220, a RAM 1230, and a user interface 1240, which may perform data communication with each other using a bus 1250. The processor 1220 may serve to execute a program and control the electronic system 1200. The RAM 1230 may be used as a working memory of the processor 1220. For example, the processor 1220 and the RAM 1230 may each include a semiconductor device according to example embodiments of the inventive concepts. The processor 1220 and the RAM 1230 may be incorporated into a single package. The user interface 1240 may be used to input or output data to the electronic system 1200. The memory system 1210 may store a code for operation of the processor 1220, data processed by the processor 1220 or external input data. The memory system 1210 may include a controller and a memory.

The electronic system 1200 may be implemented with a mobile system, a personal computer, an industrial computer or a logic system performing various functions. For example, the mobile system may be one of a personal digital assistant (PDA), a portable computer, a web tablet, a mobile phone, a wireless phone, a laptop computer, a memory card, a digital music system, and an information transmission/reception system. When the electronic system 1200 may be an apparatus capable of performing wireless communication, the electronic system 1200 may be used in a communication interface protocol of a three-generation communication system such as CDMA, GSM, NADC, E-TDMA, WCDMA, and CDMA2000.

According to example embodiments of the inventive concepts, a first spacer and an isolation pattern may be formed of a low-k dielectric material, whose dielectric constant is lower than that of a third spacer such that parasitic capacitance between bit lines may be reduced.

In addition, the isolation pattern may be formed of a material having an etch selectivity with respect to second and third spacers such that the isolation pattern may not be etched when upper portions of the second and third spacers are etched. Furthermore, it may be possible to prevent adjacent ones of bit line node contacts and/or adjacent ones of contact plugs from being unintentionally connected to each other.

The example embodiments described above are to be considered illustrative, and not restrictive, and the appended claims are intended to cover all such modifications, enhancements, and other features, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A semiconductor device comprising:
    a substrate including an active region, an upper portion of the active region comprising a source/drain region:
    a bit line on the active region, the bit line crossing the active region and extending longitudinally in a first direction;
    a plurality of isolation patterns on a side of the bit line, the plurality of isolation patterns being arranged along the first direction and comprising a first isolation pattern and a second isolation pattern that is adjacent the first isolation pattern;
    a storage node contact between the first isolation pattern and the second isolation pattern, the storage node contact contacting the source/drain region; and
    a spacer comprising a first spacer and a second spacer secuentially stacked on the side of the bit line and extending between the bit line and the storage node contact and between the bit line and the plurality of isolation patterns,
    wherein a first portion of the second spacer that is between the bit line and the storage node contact comprises an uppermost end at a first height from the substrate, a second portion of the second spacer that is between the bit line and the first isolation pattern comprises an uppermost end at a second height from the substrate, and the second height is greater than the first height, and
    wherein a first portion of the first spacer that is between the bit line and the storage node contact comprises an uppermost end at a third height from the substrate, and the third height is greater than the first height.

2. The semiconductor device of claim 1, wherein the first spacer includes a first material different from the second spacer, and
    the plurality of isolation patterns include a second material different from the second spacer.

3. The semiconductor device of claim 2, wherein the spacer further comprises an additional spacer between the first spacer and the second spacer, and
    the additional spacer includes a third material different from the plurality of isolation patterns.

4. The semiconductor device of claim 3, wherein the first spacer includes the same material as the plurality of isolation patterns.

5. The semiconductor device of claim 1, wherein the spacer further comprises a third spacer, and the first spacer, the second spacer and the third spacer are sequentially stacked on the side of the bit line,
    wherein a first portion of the third spacer that is between the bit line and the storage node contact comprises an uppermost end at a fourth height from the substrate, a second portion of the third spacer that is between the bit line and the first isolation pattern comprises an uppermost end at a fifth height from the substrate, and the fifth height is greater than the fourth height, and
    wherein the third height is greater than the fourth height.

6. The semiconductor device of claim 5, wherein the first height is equal to the fourth height.

7. The semiconductor device of claim 1, wherein an upper portion of the first portion of the first spacer is exposed by both the first portion of the second spacer and the storage node contact.

8. The semiconductor device of claim 7, wherein an upper surface of the storage node contact is at the first height.

9. The semiconductor device of claim 7, further comprising a landing pad extending along an upper surface of the storage node contact, an upper surface of the first portion of the second spacer, and a surface of the upper portion of the first portion of the first spacer.

10. The semiconductor device of claim 9, wherein a lower surface of the landing pad contacts the upper surface of the storage node contact, the upper surface of the first portion of the second spacer, and the surface of the upper portion of the first portion of the first spacer.

11. The semiconductor device of claim 10, wherein a portion of the lower surface of the landing pad that contacts the upper surface of the storage node contact and the upper surface of the first portion of the second spacer has a first width in a second direction that is larger than a second width of the upper surface of the storage node contact in the second direction, and
    wherein the second direction perpendicular to the first direction.

12. A semiconductor device comprising:
    a substrate including an active region, an upper portion of the active region comprising a source/drain region;
    a bit line on the active region, the bit line crossing the active region and extending longitudinally in a first direction;

a plurality of isolation patterns on a side of the bit line, the plurality of isolation patterns being arranged along the first direction and comprising a first isolation pattern and a second isolation pattern that is adjacent the first isolation pattern;

a storage node contact between the first isolation pattern and the second isolation pattern, the storage node contact contacting the source/drain region; and a spacer between the bit line and the storage node contact, the spacer comprising a first spacer and a second spacer sequentially stacked on the side of the bit line, wherein both the second spacer and the storage node contact expose an upper portion of the first spacer, and wherein the second spacer includes a material different from both the first spacer and the plurality of isolation patterns.

13. The semiconductor device of claim 12, wherein the plurality of isolation patterns include SiBCN, SiCN, SiOCN, or SiN, wherein the first spacer includes a low k material, SiBCN, SiBN, SiOCN, or SIN, and wherein the second spacer includes SiN or $SiO_2$.

14. The semiconductor device of claim 13, wherein the first spacer includes a low k material.

15. The semiconductor device of claim 12, further comprising a landing pad on the storage node contact, wherein the landing pad contacts a side of the upper portion of the first spacer, and wherein an upper surface of the second spacer is coplanar with an upper surface of the storage node contact.

16. The semiconductor device of claim 12, wherein the spacer extends in the first direction and extends between the bit line and the plurality of isolation patterns, wherein a first portion of the second spacer that is between the bit line and the storage node contact comprises an uppermost end at a first height from the substrate, a second portion of the second spacer that is between the bit line and the first isolation pattern comprises an uppermost end at a second height from the substrate, and the second height is greater than the first height.

17. The semiconductor device of claim 1, wherein a second portion of the first spacer that is between the bit line and the first isolation pattern comprises an uppermost end at the third height.

18. The semiconductor device of claim 17, wherein the second height is equal to the third height.

19. The semiconductor device of claim 1, wherein the first spacer includes a low k material, SiBCN, SiBN, SiOCN, or SiN, wherein the second spacer includes SiN or $SiO_2$, and wherein the plurality of isolation patterns include SiBCN, SiCN, SiOCN, or SIN.

20. The semiconductor device of claim 11, wherein the storage node contact contacts the first portion of the second spacer.

* * * * *